US007393615B2

(12) United States Patent
Ki et al.

(10) Patent No.: US 7,393,615 B2
(45) Date of Patent: Jul. 1, 2008

(54) MASK FOR USE IN MEASURING FLARE, METHOD OF MANUFACTURING THE MASK, METHOD OF IDENTIFYING FLARE-AFFECTED REGION ON WAFER, AND METHOD OF DESIGNING NEW MASK TO CORRECT FOR FLARE

(75) Inventors: Won-Tai Ki, Suwon (KR); Seong-Woon Choi, Suwon (KR); Tae-Moon Jeong, Yongin (KR); Shun-Yong Zinn, Suwon (KR); Woo-Sung Han, Seoul (KR); Jung-Min Sohn, Yongin (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 693 days.

(21) Appl. No.: 10/974,950

(22) Filed: Oct. 28, 2004

(65) Prior Publication Data
US 2005/0083518 A1 Apr. 21, 2005

Related U.S. Application Data

(62) Division of application No. 10/211,359, filed on Aug. 5, 2002, now Pat. No. 6,835,507.

(30) Foreign Application Priority Data
Aug. 8, 2001 (KR) .............................. 2001-47724
Mar. 20, 2002 (KR) .............................. 2002-15148

(51) Int. Cl.
*G03F 1/00* (2006.01)
*G06F 17/21* (2006.01)

(52) U.S. Cl. ........................................... 430/5; 716/21

(58) Field of Classification Search ..................... 430/5, 430/394; 716/19–21
See application file for complete search history.

(56) References Cited

U.S. PATENT DOCUMENTS 6,233,056 B1 5/2001 Naulieau et al.
6,815,129 B1 * 11/2004 Bjorkholm et al. ............ 430/30
2004/0021854 A1 2/2004 Hikima

* cited by examiner

*Primary Examiner*—Stephen Rosasco
(74) *Attorney, Agent, or Firm*—Volentine & Whitt, PLLC

(57) ABSTRACT

A mask for use in measuring flare produced by a projection lens of a photolithography system, a method of manufacturing the mask, a method of identifying a flare-affected region on a wafer, and a method for correcting for the flare to produce photoresist patterns of desired line widths are provided. A first photolithographic process is performed to form photoresist patterns on a test wafer using a mask including a light shielding region having a plurality of light transmission patterns and a light transmission region, and the photoresist patterns formed by light passing through the light transmission patterns of the light shielding region are compared to the photoresist patterns formed by light passing through the light transmission region. The amount of flare produced by the projection lens is quantified using the results of the comparison, and thus it is possible to identify a flare-affected region on the wafer. In addition, it is possible to form uniform photoresist patterns on the wafer by determining the open ratio of the flare-affected region and calculating an effective amount of the flare in the flare-affected region from the amount of flare of the lens and the open ratio. More specifically, a mask is produced in which the line widths of mask patterns are configured, i.e., corrected compared to the first mask, taking into consideration the effective amount of the flare.

7 Claims, 18 Drawing Sheets

MASK FOR USE IN MEASURING FLARE, METHOD OF MANUFACTURING THE MASK, METHOD OF IDENTIFYING FLARE-AFFECTED REGION ON WAFER, AND METHOD OF DESIGNING NEW MASK TO CORRECT FOR FLARE

CROSS-REFERENCE TO RELATED APPLICATIONS

This is a divisional application of application Ser. No. 10/211,359, filed Aug. 5, 2002, and now issued as U.S. Pat. No. 6,835,507.

BACKGROUND OF THE INVENTION

1. Field of the Invention

The present invention relates to photolithography. More particularly, the present invention relates to a projection lens of an exposure apparatus of a photolithography system, and to the associated phenomenon of flare that causes defects in a pattern formed on a wafer by light focused on the wafer by the projection lens.

2. Description of the Related Art

In general, flare is a phenomenon that produces a bad exposure in a photolithographic process due to defects of a projection lens of the exposure apparatus of the photolithography system. More specifically, when a portion of the surface of the lens is defective, the exposure light is dispersed at the defective portions, and photoresist patterns are formed incorrectly by the exposure light. Here, the defects at the surface of the lens which may produce flare include contaminants, scratches, or a difference in refractory indices between portions of the lens. Light passing through such defective portions of the lens during exposure scatters and thus, the light does not focus properly on the photoresist layer.

The flare phenomenon will be described more fully with reference to FIGS. 1 and 2. Referring to FIGS. 1A and 1B, an exposure apparatus for performing a photolithographic process includes a lens 14 for scaling down and projecting a light shielding pattern 11 of a mask 10 onto a predetermined portion of a wafer 12. The lens 14 is interposed between the mask 10 and the wafer 12. The top surface of the wafer 12 is coated with a photoresist layer (not shown).

As shown in FIG. 1A, if no defect occurs at the surface of the lens 14, the shielding pattern 11 on the mask 10 is projected on a reduced scale onto the photoresist layer. Accordingly, photoresist patterns 12a are formed on the wafer 12.

On the other hand, as shown in FIG. 1B, if defects occur at the surface of the lens 14, light disperses at the defective portions 15 of the lens 14. The dispersion of light results in an irregular distribution of light on the photoresist layer during the exposure, and decreases the contrast of the image. In addition, portions of the wafer 12 corresponding to and adjacent to the defective portions 15 may become excessively exposed. As a result, an on chip variation phenomenon occurs in which photoresist patterns 12b on the wafer 12 are deformed, or the widths of photoresist patterns 12b formed in one field vary. As the photolithographic process is repeated, the lens 14 of the exposure apparatus becomes more severely defective, and the amount of flare varies.

Accordingly, in photolithography, the amount of flare of a lens and the position on the wafer which is affected by flare must be measured and determined for every exposure process if the photoresist patterns are to be formed as desired.

However, conventional photolithography systems do not have tools for identifying whether flare is produced by a projection lens, for identifying whether a wafer is affected by flare, and/or for determining the extent of a flare-affected region on a wafer. Thus, it is difficult to correct for the flare, i.e., to avoid bad exposures.

SUMMARY OF THE INVENTION

An object of the present is to solve the above-described problems related to flare in the photolithography process.

More specifically, it is a first object of the present invention to provide a mask which is capable of being used in a photolithography system to identify whether flare is being produced by the projection lens of the system and to quantify the amount of flare.

It is a second object of the present invention to provide a method of manufacturing such a mask.

It is a third object of the present invention to provide a method of identifying a flare-affected region on a wafer.

It is a fourth object of the present invention to provide a method of correcting for the flare to produce the photoresist patterns having desired line widths in a region that would otherwise be affected by the flare.

It is a fifth object of the present invention to provide a method of designing the line width of transmission patterns (or shielding patterns) of a mask to compensate for the flare produced by the lens of the photolithography system with which the mask is to be used.

The mask according to the present invention includes a mask substrate having a light shielding region and a light transmission region, and a plurality of alternating line and space patterns formed in each of the light shielding region and the light transmission region. The line and space patterns formed in the light shielding region correspond to the line and space patterns formed in the light transmission region.

The plurality of line patterns all have the same line width, and the plurality of space patterns all have the same line width. The space patterns may be light transmission patterns in the form of grooves interposed between the line patterns.

A main light shielding layer formed on a predetermined portion of the mask substrate may divide the mask substrate into the light shielding region and the light transmission region. The main light shielding layer defines at least one group (row, for example) of light transmission patterns. At least one sub light shielding layer is formed in the light transmission region of the mask substrate, and defines at least one group of light transmission patterns corresponding to those defined by the main light shielding layer.

A plurality of rows of the light transmission patterns are formed in the main light shielding layer as spaced from one another in a longitudinal direction of the mask. Likewise, a plurality of rows of light transmission patterns are formed in the at least one sub light shielding layer as spaced form one another in the longitudinal direction.

The light transmission patterns all have the same size. In addition, the (latitudinal) spacing of the light transmission patterns in the rows thereof is uniform, and the longitudinal spacing of the rows of the light transmission patterns is also uniform.

The boundary between the main light shielding layer and the light transmission region is preferably linear and extends at a right angle to a line passing through the centers of longitudinally aligned ones of the light transmission patterns. The light shielding region and the light transmission region may have the same size, and the light transmission patterns are located along a longitudinal area of the mask substrate.

In order to manufacture the mask, a light shielding layer of a light-blocking material is first formed on the mask substrate (transparent). At least one light transmission pattern is formed in the light shielding layer. Subsequently, the main light shielding layer is formed by removing one portion of the light shielding layer from the light transmission region, and the at least one sub light shielding layer is formed by leaving a portion of the light shielding layer in the light transmission region around the light transmission patterns.

In forming the light transmission pattern and forming the main light shielding layer, portions of the main light shielding layer may be removed such that the light transmission patterns join the boundary between the main light shielding layer and the light transmission region.

In order to identify a flare-affected region on a wafer, photoresist patterns are formed on the wafer using the mask to carry out a photolithography process. The line widths of photoresist patterns formed by the line and space patterns of the light shielding region of the mask, and the line widths of the photoresist patterns formed by the line and space patterns of the light transmission region of the mask are measured. Next, the line widths of the photoresist patterns are compared. If the difference in the line widths of the photoresist patterns differ by more than a predetermined value, such as the calibrated precision of the measuring apparatus, it is determined that the projection lens is producing flare. The amount of flare is calculated based on the difference in line widths between the photoresist patterns formed by light from the light shielding region of the mask and the photoresist patterns formed by light from the light transmission region of the mask.

Next, an interval over which the line widths of the photoresist patterns vary considerably in a region corresponding to the boundary between the light shielding region and the light transmission region of the mask is discerned. Then, a circular region of the wafer, having a radius equal to the interval is estimated as having been affected by the flare. The circular region is deemed to be centered at a position corresponding to the boundary between the light transmission region and the light shielding region.

Once the flare-affected region of the test wafer is identified, it can be analyzed to manufacture a new mask that will correct for the flare produced by the projection lens. To this end, the effective amount of flare in the flare-affected region is calculated. Then, the light transmission patterns of the new mask are designed, i.e., configured, based on the effective amount of flare such that when the new mask is used in the photolithography system, the photoresist patterns will have the desired line widths despite the flare produced by the projection lens. In particular, the line widths of light transmission patterns formed in a mask region corresponding to the flare-affected region and the spacing between the light transmission patterns are set up in the new mask taking the effective amount of flare into consideration.

In measuring the effective amount of flare in the flare-affected region, the open ratio of the flare-affected region is determined, and the amount of flare in the flare-affected region is calculated by converting the amount of flare influencing all of the entire exposed regions of the wafer into the open ratio of the flare-affected region.

In order to ensure an even greater accuracy in the design of the new mask, the region on the test wafer on which the photoresist patterns are formed is discriminated into a plurality of mesh regions constituting a matrix. Convolution values with respect to the line widths of the photoresist patterns in each mesh region are calculated. An error value of the critical dimension (CD) of the photoresist patterns in each mesh region is calculated using the following Equation:

$$CD\ error\ wafer = \frac{convolution\ value}{convolution\ max} \times Max\ CD\ error$$

In this equation, "CD error wafer" represents an error value of the CD of the photoresist patterns in each mesh region on a corresponding wafer, and "convolution value" represents the convolution value with respect to the line widths of the photoresist patterns in each mesh region on the corresponding wafer, and "convolution max" represents the maximum value of all of convolution values with respect to the mesh regions, and "Max CD error" represents the maximum difference in the line widths of the photoresist patterns.

Then, the error value of the CD is factored into the design of the patterns in a region of the new mask corresponding to the mesh region.

Still further, an error value of critical dimension (CD) of the photoresist patterns in each mesh region is calculated using the following Equation 1. A mask error enhancement factor (MEEF) of the reduction projection exposure apparatus of the photolithography system for forming the photoresist patterns is calculated. The error value of the CD of patterns in the mask is measured using the following Equation 2. The CD of the patterns of the new mask is designed based on the error value of the CD of the patterns of the original mask.

$$CD\ error\ wafer = \frac{convolution\ value}{convolution\ max} \times Max\ CD\ error \quad [Equation\ 1]$$

$$CD\ correction\ mask = \frac{Mag \times CD\ error\ wafer}{MEEF} \quad [Equation\ 2]$$

In Equation 2, "Mag" represents a reduction projection multiple of the exposure apparatus.

BRIEF DESCRIPTION OF THE DRAWINGS

The above and other objects, features and advantages of the present invention will become more apparent from the following detailed description of the preferred embodiments thereof made with reference to the attached drawings, of which.

DETAILED DESCRIPTION OF THE PREFERRED EMBODIMENTS

Figure 1A:
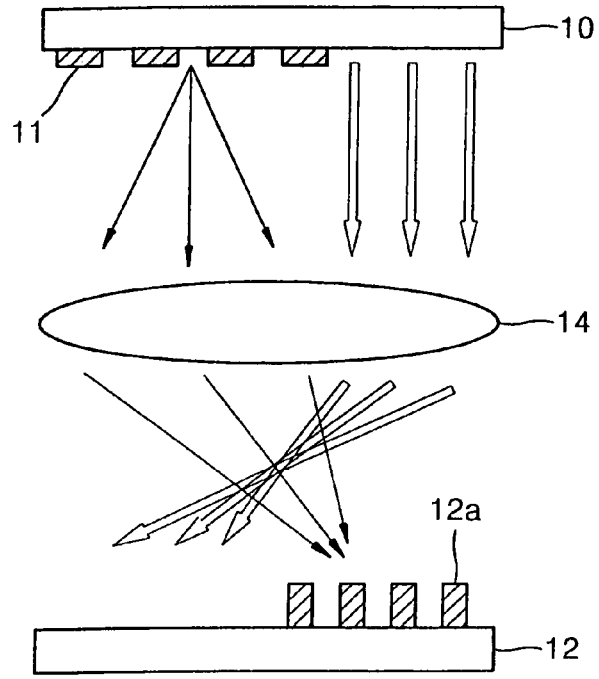
FIG. 1A is a schematic cross-sectional view of a portion of an exposure apparatus illustrating an exposure process in which a flare phenomenon is not occurring.
Figure 1B:
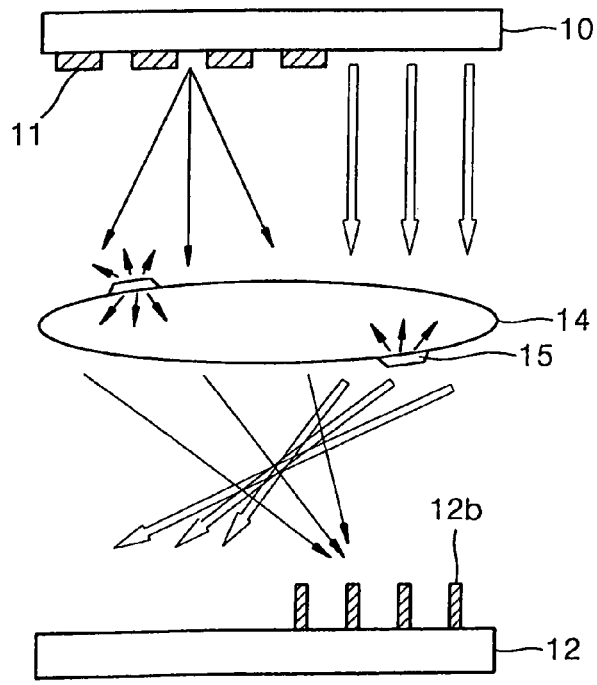
FIG. 1B is a schematic cross-sectional view of a portion of an exposure apparatus illustrating an exposure process in which a flare phenomenon is occurring.

The present invention will now be described more fully with reference to the accompanying drawings. In the drawings, the thickness of layers and regions are exaggerated for clarity. It should also be understood that when a layer is described as being disposed "on" another layer or substrate, such a description includes the layer in question being disposed directly on the other layer or substrate, or intervening layers existing therebetween. Also, the terms "blocking" and "transparent" to exposure light refer to the ability of the light shielding regions and light transmission region/patterns to produce significant contrast in the transmitted light pattern. Accordingly, "blocking exposure light" refers to a region being opaque or semi-opaque, whereas "transparent to exposure light" refers to a region/pattern being at least translucent. In addition, like reference numerals are used to designate like elements throughout the drawings.

Figure 2:
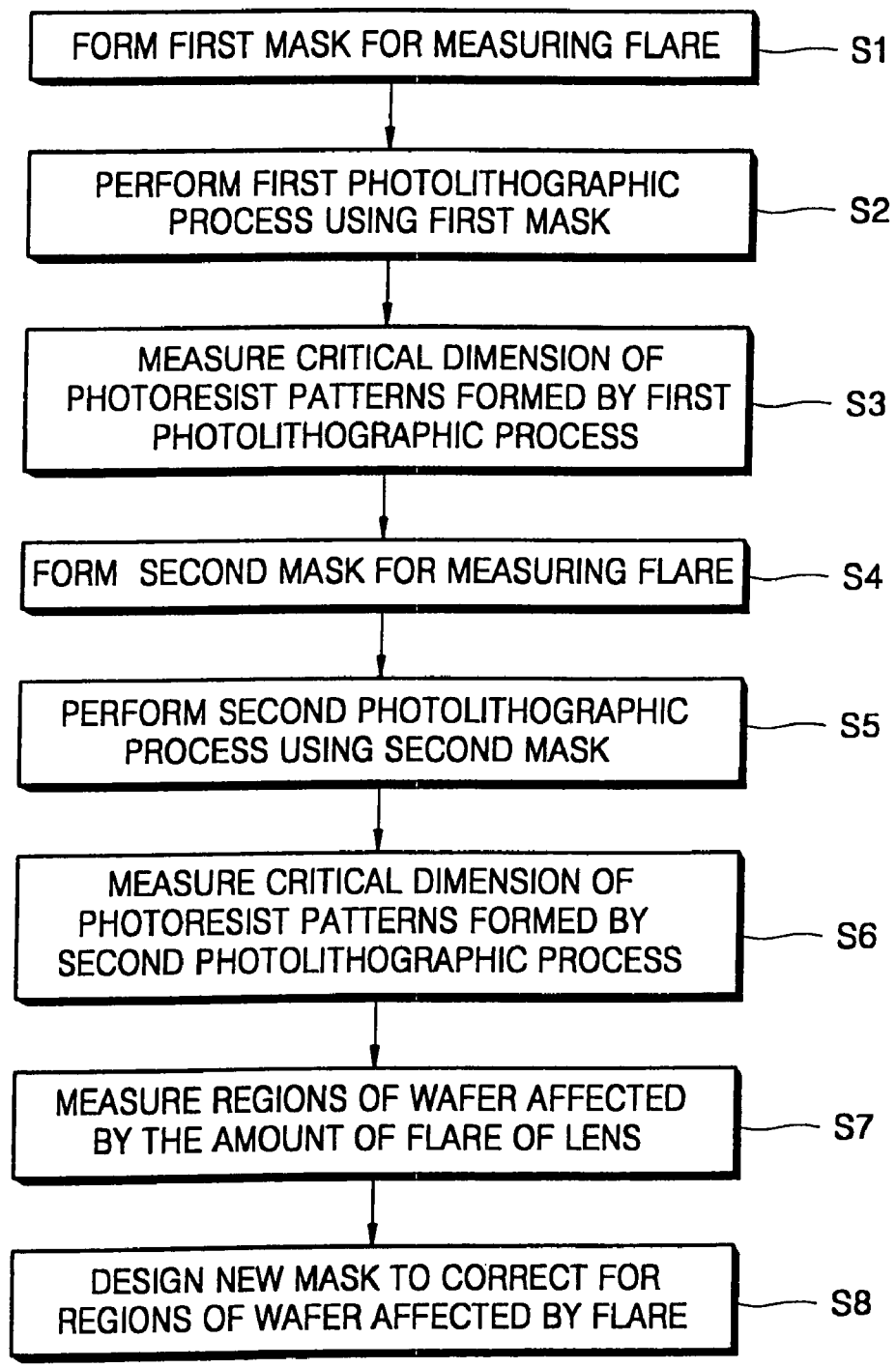
FIG. 2 is a flow chart of a method of measuring the range of a flare-affected region on a wafer and a method of correcting patterns formed in the flare-affected region on the wafer.
Figure 3:
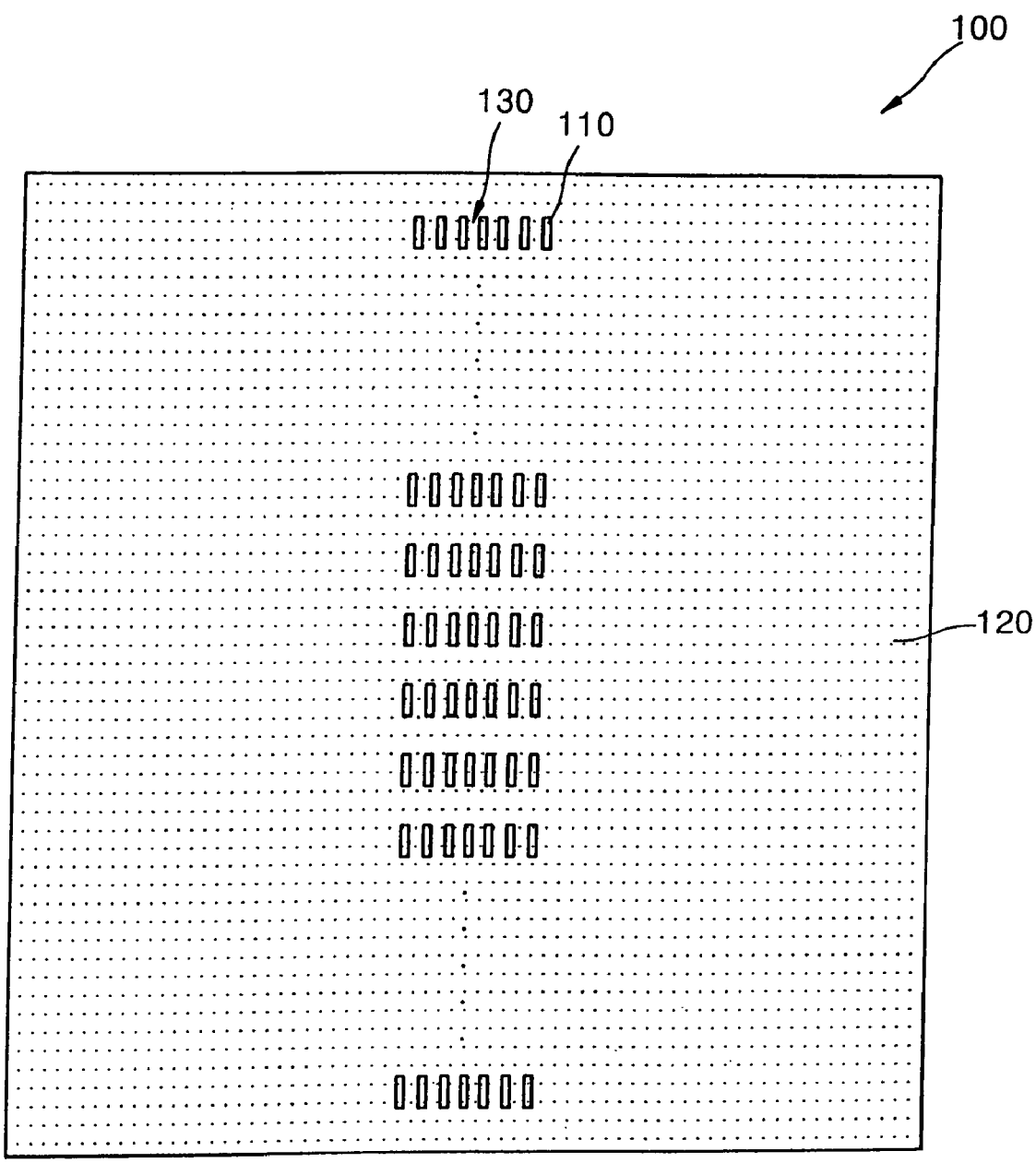
FIG. 3 is a plan view illustrating a first mask for measuring flare according to the present invention.

Referring to FIG. 2, a first mask 100 for measuring the flare of a lens is formed or otherwise provided in step S1. The first mask 100, as shown in FIG. 3, includes a mask substrate, and a light shielding layer 120 in which a plurality of light transmission patterns 110 are defined at regular intervals on the surface of the mask substrate. Here, line patterns 130 are defined in the light shielding layer 120 by the light transmission patterns 110. That is, each line pattern 130 is defined between laterally adjacent ones of the light transmission patterns 110. The mask substrate of the first mask 100 may be a transparent substrate, for example, a quartz substrate, and the light shielding layer 120 may be formed of a material which blocks incident light, such as chromium (Cr).

The light transmission patterns 110 may be, for example, grooves formed in the light shielding layer 120. The light transmission patterns 110 are arranged side-by-side in rows spaced from one another in a longitudinal direction of the mask 100. For example, each row consists of seven light transmission patterns 110 spaced laterally from one another at regular intervals. In addition, the light transmission patterns 110 are all of the same size. Accordingly, the lateral distances between adjacent ones of the light transmission patterns 110, that is, the line widths of the line patterns 130, are all the same. In addition, the longitudinal distances between adjacent ones of the light transmission patterns 110, i.e., between adjacent rows of the light transmission patterns 110, are all the same. The light transmission patterns 110 are located along a longitudinal central area of the first mask 100. In the present embodiment, the widths of the light transmission patterns 110 and of the line patterns 130 are 0.15 μm.

Figure 4:
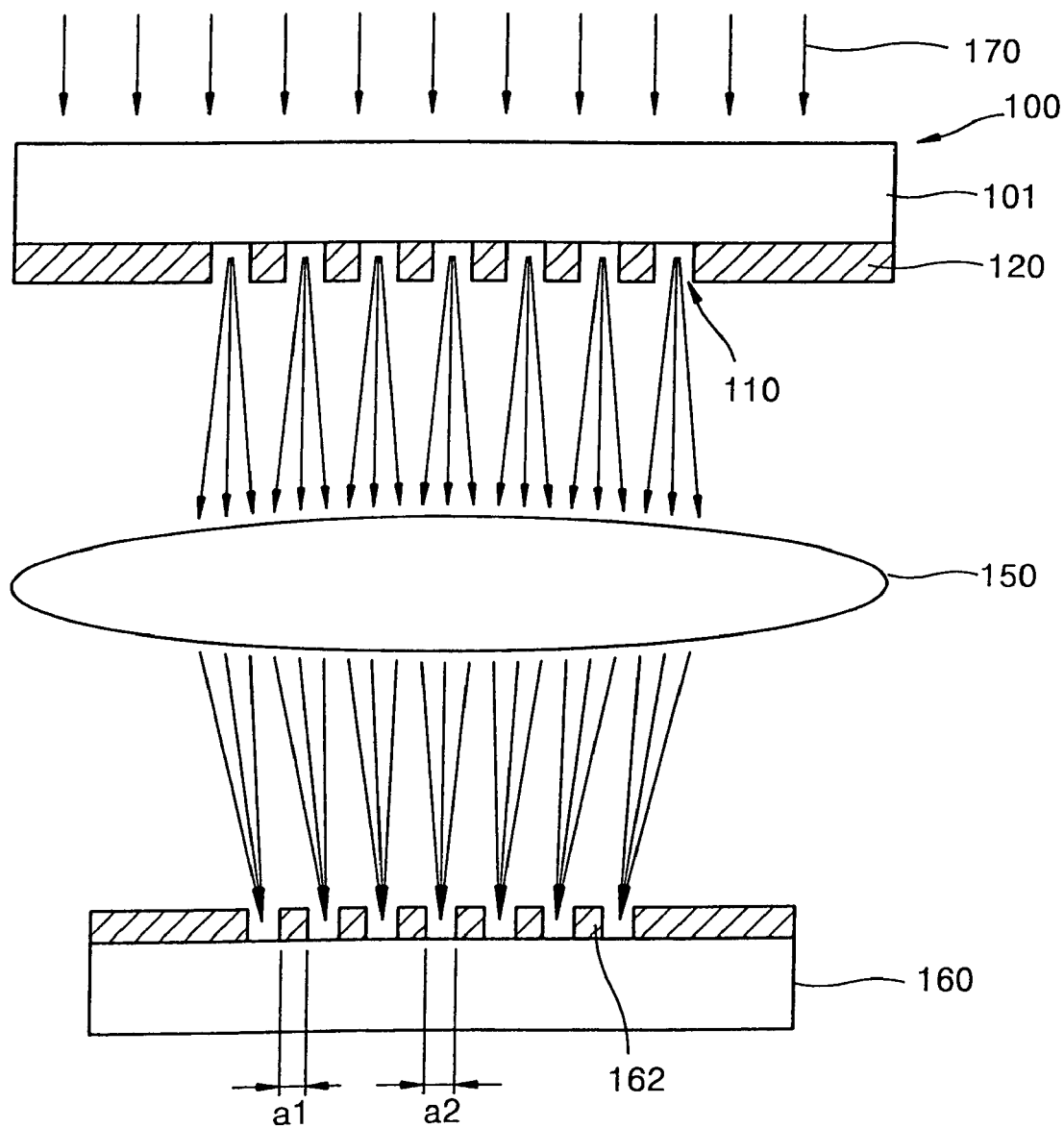
FIG. 4 is a schematic cross-sectional view of a portion of an exposure apparatus illustrating a first photolithographic process of the present invention.

Referring back to FIG. 2, a first photolithographic process is performed using the first mask 100, in step S2. As shown in FIG. 4, the first mask 100 is disposed above a wafer 160 coated with photoresist, and then the first photolithographic process is performed. In the figure, reference numeral 101 designates the substrate of the first mask 100.

In this process, the lens 150 of the exposure apparatus is interposed between the first mask 100 and the wafer 160 to project the pattern of the light shielding layer 120 of the first mask 100 onto the wafer 160 on a reduced scale. The exposure light 170 is absorbed by the first mask 100 at locations where the light shielding layer 120 exists, but passes directly through the first mask 100 at locations where the light transmission patterns 110 are formed. The exposure light 170 passing through the first mask 100 is focused onto the photoresist layer by the lens 150 such that predetermined portions of the photoresist layer are exposed. In the first photolithographic process, a U-line exposure apparatus, manufactured by ASML Co. Ltd., can be used to expose the photoresist layer. Next, the exposed portions of the photoresist layer are developed, thereby forming photoresist patterns 162.

Referring to FIGS. 2 and 4, the line width a1 of each of the photoresist patterns 162 and the gap a2 between the photoresist patterns 162, that is, the critical dimensions (CDs), are measured in step S3. As mentioned above, the light transmission patterns 110 of the first mask 100 all have the same size. Thus, if the exposure apparatus, and in particular, the projection lens 150, has no defects, the line widths a1 of the photoresist patterns 162 and the gaps a2 between the photoresist patterns 162 will be uniform.

Figure 5:
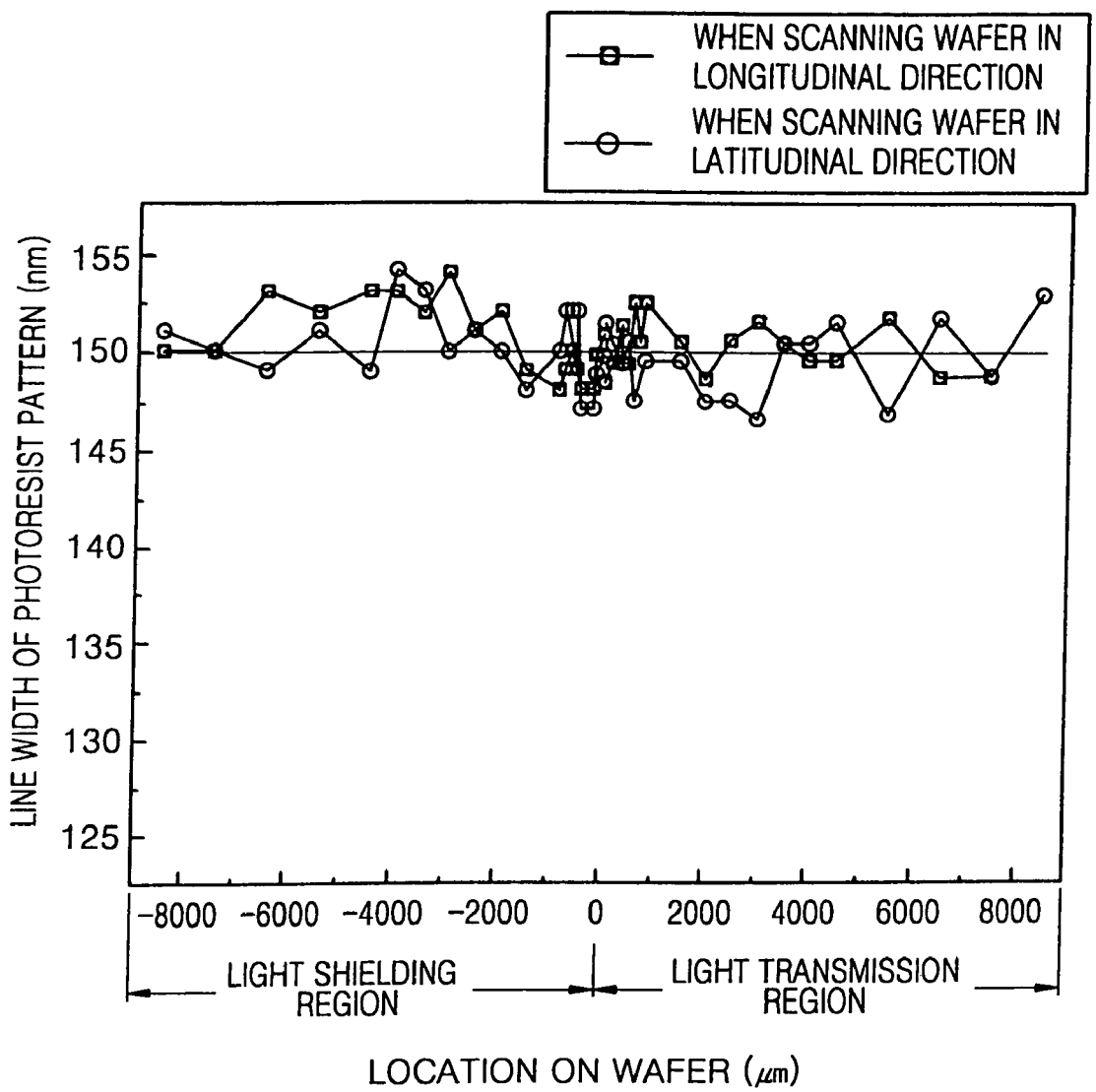
FIG. 5 is a graph showing the line widths of photoresist patterns formed in different areas on a wafer by the first photolithographic process.

FIG. 5 is a graph showing line widths a1 of the photoresist patterns 162 formed in different regions on the wafer 160. Specifically, FIG. 5 shows the results of measuring the line width a1 of each of the photoresist patterns 162 by scanning the wafer in longitudinal and latitudinal directions. As shown in FIG. 5, the sizes of the photoresist patterns 162 formed by the light transmission patterns 110 are uniform over the entire surface of the wafer and the photoresist patterns 162 each have a line width of about 150 nm. The first photolithographic process is performed using the first mask 100 in order to determine whether the first mask 100 is uniform and to show that as the opening ratio of the first mask 100 approaches 0, in other words, as more parts of the first mask 100 are blocked, the line widths of the photoresist patterns 162 do not vary considerably, irrespective of the existence of flare.

Figure 6:
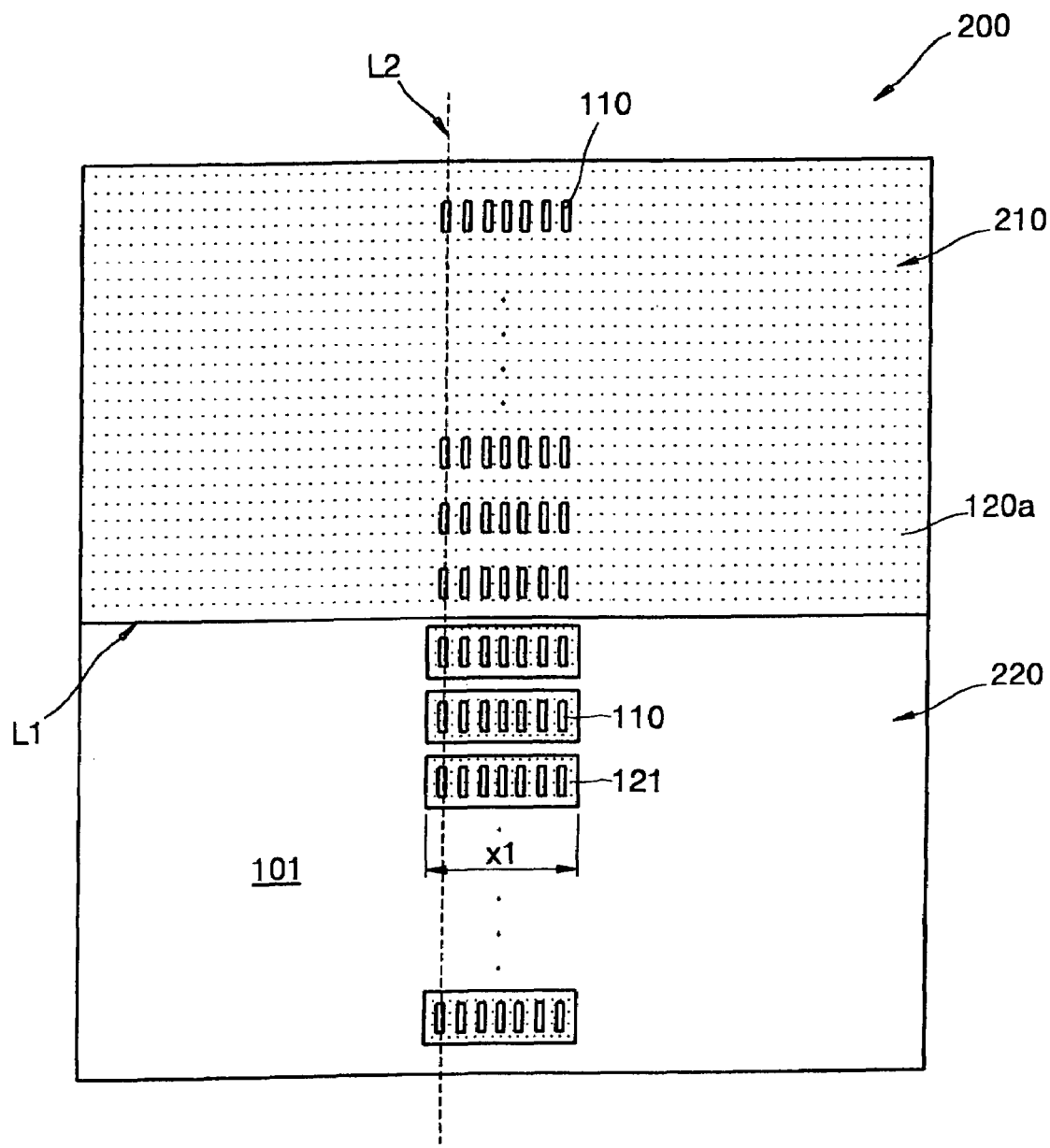
FIG. 6 is a plan view of a mask for use in measuring flare according to the present invention.

Referring to FIGS. 2 and 6, a predetermined portion of the light shielding layer 120 of the first mask 100 is removed, thereby forming a second mask 200 for measuring flare in step S4. As shown in FIG. 6, the second mask 200 comprises a main light shielding layer 120a and at least one sub light shielding layer 121. The main light shielding layer 120a is the main part of the light shielding layer 120 that remains after the predetermined portion of the light shielding layer 120 has been removed. On the other hand, the sub light shielding layers 121 are portions of the light shielding layer 120 that remain in a region on the substrate from which the predetermined portion of the light shielding layer 120 of the first mask 100 has been removed.

That is, the second mask 200 is divided into a light shielding region 210 constituted by the main light shielding layer 120a, and a light transmission region 220 constituted by the sub light shielding layers 121. However, a plurality of light transmission patterns 110 remain in the main light shielding layer 120a and hence, the respective longitudinal intervals and latitudinal intervals between these light transmission patterns 110 are uniform. Each sub light shielding layer 121 comprises a row of light transmission patterns 110 corresponding to those of a row of light transmission patterns 110 of the main light shielding layer 120a. That is, the light shielding material of each sub light shielding layer 121 surrounds, i.e., defines, a row of light transmission patterns 110. The sub light shielding layers 121 are simultaneously formed with the main light shielding layer 120a and are located on the same plane as the main light shielding layer 120a. Furthermore, the sub light shielding layers 121 are all of the same size, and are spaced from one another in the aforementioned longitudinal direction of the mask. More specifically, the sub light shielding layers 121 are in the form of islands in the light transmission region 220.

In the second mask 200 according to the present invention, the light shielding region 210 and the light transmission region 220 may have the same size. In addition, the border between the light shielding region 210 and the light transmission region 220 may be in the form of a straight line L1, wherein the straight line L1 preferably lies at right angles to another straight line L2 passing through the center of longitudinally aligned ones of the light transmission patterns 110 of the light shielding region 210 and the light transmission region 220. Still further, the areas occupied by the sub light shielding layers 121 are very small relative to the area of the light transmission region 220. Finally, in FIG. 6, reference character x1 designates the width of each of the sub light shielding layers 121.

Figure 7:
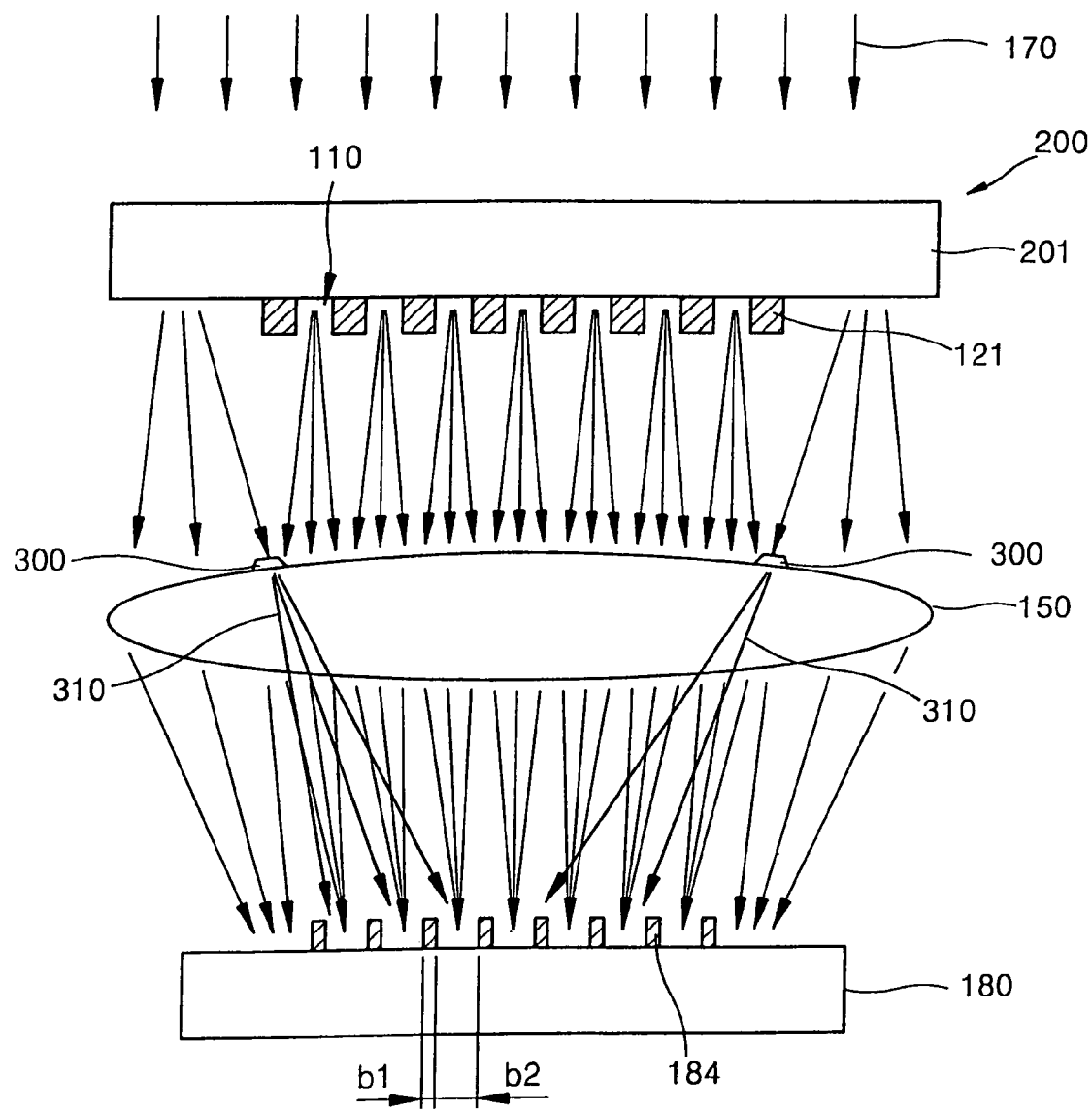
FIG. 7 is a schematic cross-sectional view of a portion of an exposure apparatus illustrating a second photolithographic process of the present invention.

Referring to FIGS. 2 and 7, a second photolithographic process is performed using the second mask 200 in step S5. Specifically, as shown in FIG. 7, a wafer 180 covered with a photoresist layer is exposed using the second mask 200. In this case, the wafer 180 may be the same wafer 160 used in the first photolithographic process, or may be a new test wafer. In order to use the first wafer 160 as the wafer 180 in the second photolithographic process, the photoresist patterns previously formed on the wafer 160 by the first photolithographic process are removed, and then a new photoresist layer is formed on the wafer 160. As in the first photolithographic process (S2), the lens 150 for projecting mask patterns onto the photoresist layer on a reduced scale is interposed between the second mask 200 and the wafer 180. In this process, though, the exposure light 170 is absorbed by the second mask 200 at locations where the main light shielding layer 120*a* and the sub light shielding layers 121 are present, but directly passes through the second mask 200 at locations where the light transmission patterns 110 are formed. The light 170 passing through the second mask 200 is focused onto the photoresist layer of the wafer 180 by the lens 150, thereby forming photoresist patterns 184. A U-line exposure apparatus manufactured by ASML Co. Ltd., can also be used to expose the photoresist layer in the second photolithographic process.

The line widths b1 of the photoresist patterns 184, and the gaps b2 between the photoresist patterns 184, in other words, the critical dimensions (CDs), are measured in step S6. The line widths can be measured using a scanning electron microscope (SEM).

Figure 8:
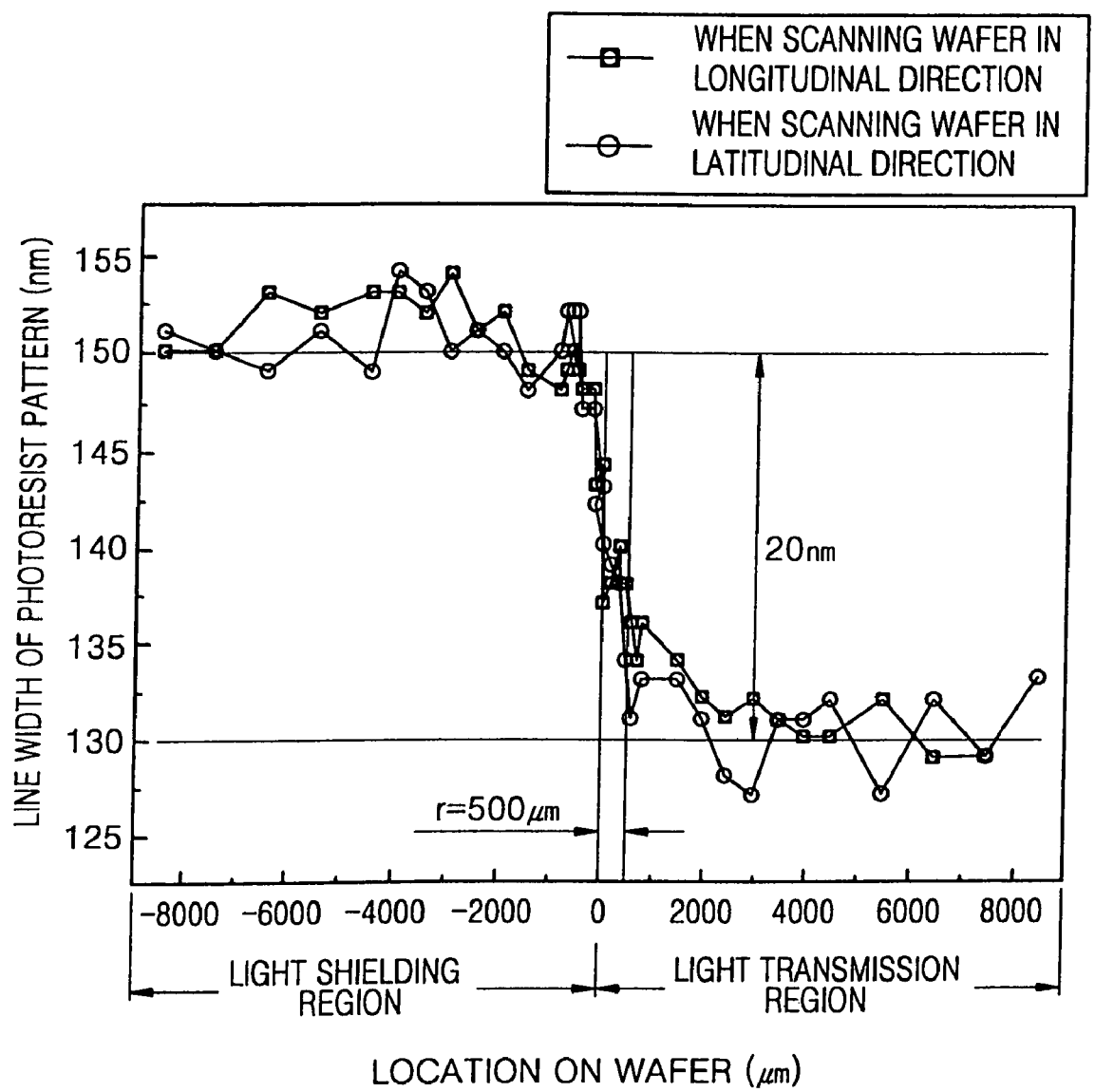
FIG. 8 is a graph showing the line widths of photoresist patterns formed in different areas on a wafer by the second photolithographic process.

FIG. 8 is a graph showing the line widths b1 of the photoresist patterns 184 formed in different areas on the wafer 180 by the second photolithographic process. Specifically, FIG. 8 shows the results of measuring the line width b1 of each of the photoresist patterns 184 by scanning the wafer in longitudinal and latitudinal directions. As shown in FIG. 8, there exists a considerable difference in line width between the photoresist patterns 184 formed by light from the light shielding region 210 and the photoresist patterns 184 formed by light from the light transmission region 220; this is the result of flare.

In most cases, if the lens 150 (see FIG. 7) has no critical defects, photoresist patterns formed using the second mask 200, like the photoresist patterns shown in FIG. 5, have a uniform line width. However, if the lens 150 has defective portions 300, light passing through the defective portions 300 of the lens 150 is dispersed, and the dispersed light 310 shown in FIG. 7 propagates to the surface of the wafer 180. Accordingly, predetermined portions of the wafer 180, corresponding to the defective portions 300 of the lens 150 and other portions adjacent the defective portions 300, are excessively exposed. Thus, the line widths of the photoresist patterns 184 vary. In the example shown in FIG. 8, the average line width of the photoresist patterns 184 formed by light from the light shielding region 210 is about 150 nm, whereas the average line width of the photoresist patterns 184 formed by light from the light transmission region 220 is about 130 nm. Accordingly, there is an average difference of about 20 nm between the line width of any of the photoresist patterns 184 formed by light from the light shielding region 210 and the line width of any of the photoresist patterns 184 formed by light from the light transmission region 220.

Figure 9:
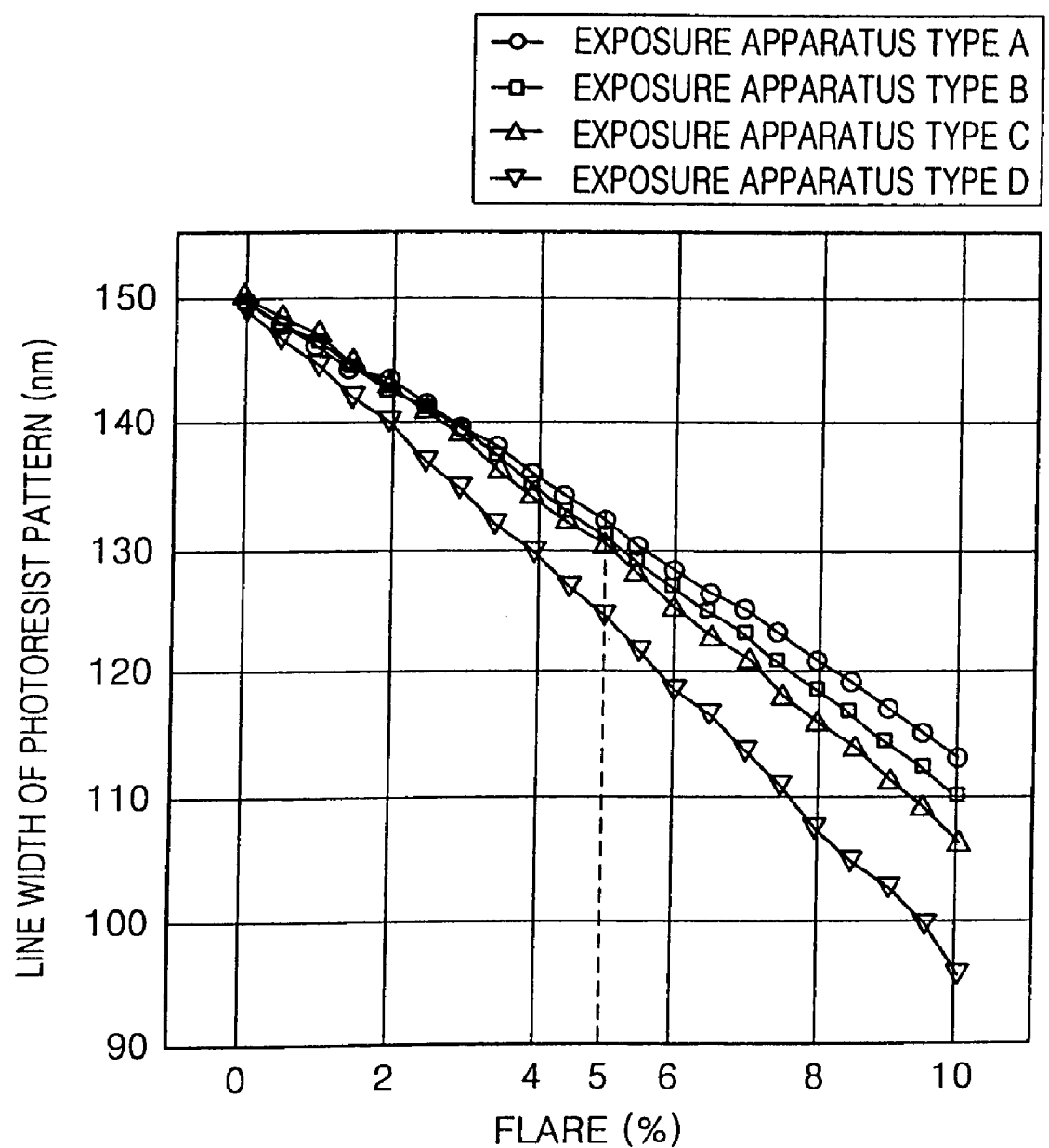
FIG. 9 is a graph showing the variation in the line widths of photoresist patterns with respect to the amount of flare, the patterns being produced using a 700-series ASML stepper.

The amount of flare is estimated in consideration of the average difference in line widths between the photoresist patterns 184 formed by light from the light shielding region 210 and the photoresist patterns 184 formed by light from the light transmission region 220. If this difference in line widths exceeds a measurement error (deviation in measuring precision) of the measurement apparatus, the extent of a flare-affected region on the wafer 180 is measured in step S7 (FIG. 2). Note, the flare of the lens 150 affects the entire surface of the wafer 180 exposed using the mask 200, that is, all exposure fields, and can be obtained easily by standard computer programs using the difference in line widths between the photoresist patterns 184 formed by light from the light shielding region 210 and the photoresist patterns 184 formed by light from the light transmission region 220. FIG. 9 is a graph showing variations in the line widths of photoresist patterns correlated to the amount of flare using such computer programs, for various types of exposure apparatus. In the example carried out according to the present invention, when an exposure condition (apparatus type) C was employed, the average difference in line width between the photoresist patterns 184 formed by light from the shielding region 210 and the photoresist patterns 184 formed by light from the transmission region 220 was about 20 nm, and the line width of the photoresist patterns formed by light from the light transmission region 220 was about 130 nm. Accordingly, the computer program indicates that the lens 50 has a flare of about 5%.

Hereinafter, a method of how the flare-affected region of the wafer can be measured will be explained.

As shown in FIG. 8, the plot of the graph has a steep slope at a region corresponding to the boundary between the light shielding region 210 and the light transmission region 220. Specifically, the curve plummets in a region corresponding to an interval (r of FIG. 8) of 0 μm to 500 μm from the boundary between the light shielding region 210 and the light transmission region 220, and does not vary considerably outside this interval of 500 μm. The pronounced difference in the line widths of the photoresist patterns 184 in the interval (r) of 0-500 μm is caused by the flare of the lens 150. Accordingly, regions of the wafer 180 which correspond to an interval of 0-500 μm from the boundary between the light shielding region 210 and the light transmission region 220 are determined as being affected by the flare of the lens. In FIG. 8, the slope of the illustrated curve is steep only within a region corresponding to an interval of 0-500 μm within the light transmission region 220. However, it should be expected that a region of the wafer corresponding to an interval of 0-500 μm extending into the light shielding region 210 from the boundary between the light shielding region 210 and the light transmission region 220 is also affected by flare.

Figure 10:
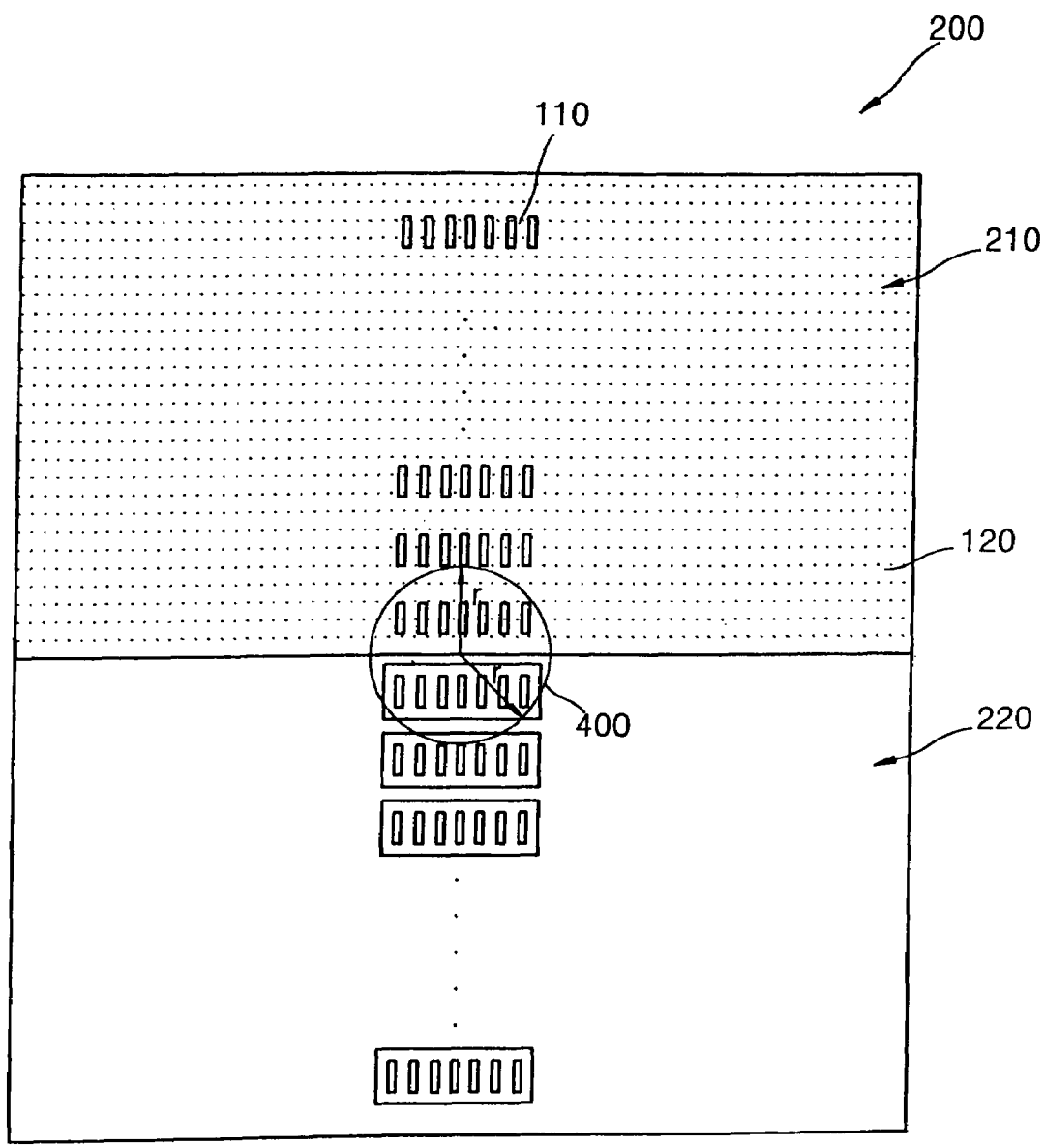
FIGS. 10, 11, 12A, 12B, 13, 14, 15A, and 15B are plan views of various embodiments of a second mask according to the present invention.

Referring to FIGS. 8 through 10, once this interval (r) is determined (in the present example, 0 μm to 500 μm from the boundary between the light shielding region 210 and the light transmission region 220), a circle 400 encompassing all of the points within the interval (r) is laid out from the boundary between the light shielding region 210 and the light transmission region 220 (represented by 0 μm along the X-axis of FIG. 8). Accordingly, the region of the wafer 180 corresponding to the inside of the circle 400 is judged as being affected by flare.

Next, the photoresist patterns 184 formed in the flare-affected region are corrected (step S8). As described above, the photoresist patterns 184 formed in the flare-affected region have a smaller than desired line width (size). The difference between the line width of each of the photoresist patterns 184 formed in the flare-affected region and the desired line width is calculated as follows. First, the open ratio of the photoresist patterns 184 formed in the flare-affected region is measured. The open ratio is generally defined as the ratio (CL/DK) of the area of a closed region (DK) with respect to the area of an open region (CL). In the present invention, the open ratio is obtained as a ratio of the entire area of the light transmission patterns 110 with respect to the area of the flare-affected region covered by the main and sub light shielding layers 120a and 121. Next, the amount of flare of the lens 150 according to the difference in line widths between the photoresist patterns 184 shown in FIG. 9 is converted into the open ratio of the flare-affected region. Then, an effective amount of flare of the flare-affected region is measured. In other words, the amount of flare of the lens 150 shown in FIG. 9 is the amount of flare of the lens 150 in the case where the open ratio of the photoresist patterns 184 is 100%. Thus, the effective amount of flare in the flare-affected region is calculated by multiplying the open ratio of the corresponding regions by the amount of flare in the case where the open ratio of the corresponding regions is 1.

Subsequently, a new mask is manufactured in which the line width of the line patterns 130 (see FIG. 3) in a region of the mask corresponding to the flare-affected region is comparatively greater by an amount based on the effective amount of flare. Accordingly, photoresist patterns are uniformly formed on a wafer using this new mask even though the projection lens 150 still produces flare. In the present embodiment, the center of the region where flare is generated, i.e., the center of circle 400, is located at the boundary between the light shielding region 210 and the light transmission region 220. Thus, the open ratio is about 50%, and the amount of flare of the lens 150 is about 5%. Accordingly, the actual amount of flare is about 2.5%.

Thus, according to the present invention, whether flare occurs in the lens of the exposure apparatus is determined and, if so, the extent of a region of a wafer affected by the flare is quantified. Thus, it is possible to correct for the flare produced by the lens so that patterns having the desired line widths will nonetheless be formed.

In addition, photoresist patterns having the desired line widths can be formed even more accurately using the following steps in designing the new mask.

Figure 16:
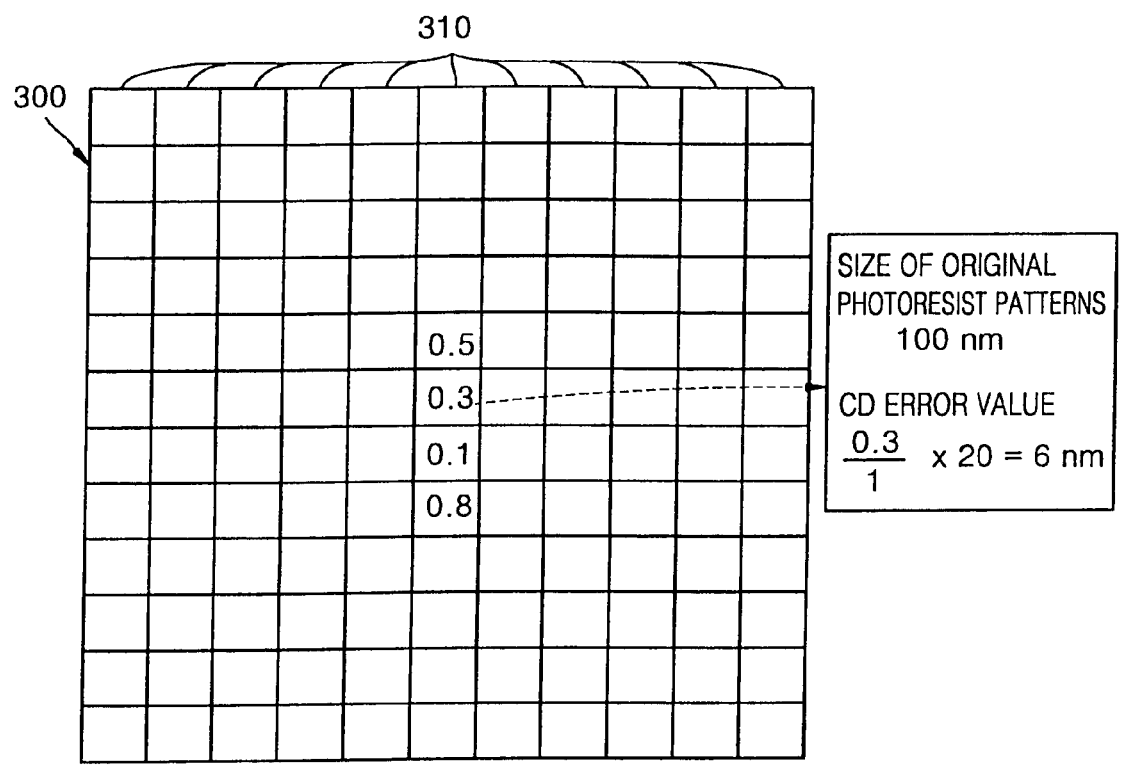
FIG. 16 is a plan view of a wafer illustrating a method used to design the line widths of patterns in a mask for producing photoresist patterns having desired line widths.

As mentioned above, photoresist patterns are formed on a wafer by performing an exposure process using the second mask 200. Then, the region in which the photoresist patterns are formed by the second mask 200 is divided in longitudinal and latitudinal directions, as shown in FIG. 16, i.e., the region is discriminated into mesh regions 310 of a matrix 300. Subsequently, the line widths of the photoresist patterns (not shown) in each mesh region 310 are measured, and then the measured line widths are shown by gaussian distribution, and a convolution operation on the measured line widths is performed, thereby obtaining respective convolution values for the line widths of the photoresist patterns of the mesh regions 310. The convolution operation, which is well-known per se, is an operation in which one function in one region of a time region or a frequency region moves symmetrically with respect to the y-axis, overlaps on another function and is integrated as follows:

$$g(t) \times w(t) = \int_{-\infty}^{\infty} g(\tau)w(t-\tau)d\tau.$$

Using the convolution values with respect to the line widths of the photoresist patterns, an error value of a critical dimension (CD) in each mesh region 310 is calculated using the following Equation. Here, the error value of the CD represents a difference in the line widths of the photoresist patterns.

$$\text{CD error wafer} = \frac{\text{convolution value}}{\text{convolution max}} \times \text{Max CD error} \quad \text{[Equation 1]}$$

Here, as described above, "CD error wafer" represents an error value of the CD in each mesh region 310 on a flare effected region of a corresponding wafer (a wafer that is formed using photoresist patterns as a second mask), and "convolution value" represents a convolution value with respect to the line widths of the photoresist patterns in each mesh region 310 on the corresponding wafer. In addition, "convolution max" represents a maximum value of convolution values in the entire matrix of mesh regions 310 and is "1" in a region in which the open ratio is 0%, and thus the maximum value of the convolution values is 1. In addition, "Max CD error" represents a maximum difference in the line widths of the photoresist patterns and is 20 nm in the graph shown in FIG. 8.

As a result, an error value of the CD in each mesh region 310 can be quantified by calculating the convolution value in each mesh region 310 using Equation 1. If the error value of the CD is measured in this manner, the line widths of the light transmission patterns (see 110 of FIG. 6) or the line widths of the line patterns 130 between the light transmission patterns 110 in a mask region corresponding to the mesh region 310 as much as the error value of the CD are designed to correct the line widths of the photoresist patterns.

As an example, FIG. 16 shows the convolution values with respect to several mesh regions 310. A mesh region for which the convolution value is 0.3 will be described below.

First, assuming the convolution value in a mesh region 310 to be 0.3, and the CD value of the original photoresist patterns to be 100 nm, and in a case where a maximum CD error value is 20 nm, the error value of the CD of the photoresist patterns in each mesh region 310 is 6 nm, and the size of the photoresist patterns formed in each mesh region 310 is 94 nm, which is 6 nm smaller than the original size. That is, an overexposure process is performed by the dispersion light, i.e., due to flare, whereby the line widths of the photoresist patterns are 6 nm less than the desired size (original size if the projection lens did not produce flare).

In light of this determination, the mask region corresponding to the mesh regions 310 and in particular, the line patterns thereof are designed to produce line widths that are 6 nm larger than the desired (original) size if the exposure process were flare-free. To this end, in a case in which the reduction projection ratio of the exposure apparatus is 1:1, the spacing of the line patterns in the new mask is formed to be about 6 nm larger. In a case in which the reduction projection ratio of the exposure apparatus is 4:1, the spacing of the line patterns is formed to be about 24 nm larger. Thus, when a mask having such line patterns 130 is used to expose the wafer, photoresist patterns having line widths of 100 nm are formed on the wafer despite the presence of flare in the projection lens.

The error value of the CD is generated by errors affected by flare and errors occurring in the exposure apparatus. Accordingly, in the present invention, a mask error enhancement factor (MEEF), which is an error factor of a mask, is obtained. Then, a correction value of the CD for the mask is obtained on the basis of the MEEF. The MEEF will be explained in more detail as follows.

For example, in a case where the size (line widths) of patterns of the mask is 0.42 µm, and the patterns are transcribed onto a substrate using the mask and a 4-multiple reduction projection exposure apparatus, photoresist patterns will have line widths of 0.105 µm if there is no error in the exposure apparatus. In this case, the MEEF is 1. However, if the line widths of the photoresist patterns are 0.11 µm, the photoresist patterns are about 0.05 µm larger than the original size, and thus the MEEF is 2.

Using the MEEF and the error value of the CD of the photoresist patterns, the correction value of the CD for the mask can be obtained from Equation 2.

$$\text{CD correction mask} = \frac{Mag \times \text{CD error wafer}}{MEEF} \qquad \text{[Equation 2]}$$

Here, "CD correction mask" represents an error value of the CD of patterns in the mask, "MEEF" represents an error factor of a reduction projection exposure apparatus, and "Mag" represents a reduction projection multiple. In this example, a 4-multiple reduction projection exposure apparatus is used and thus, the "Mag" is 4. In addition, "CD error wafer" represents the error value of the CD in each mesh region 310 on the wafer.

The error value of the CD of the patterns in the mask is more precisely obtained taking into consideration the convolution values and the error factor of the exposure apparatus, and the CD of the patterns in the mask is designed accordingly. That is, the design CD of the patterns of the new mask differs, compared to that of the second mask 200, by an amount corresponding to the error value.

FIGS. 11, 12A, 12B, 13A, 13B, 14, 15A, and 15B are plan views of various embodiments of the second mask. As shown by these figures, the second mask can be embodied in many different ways.

Figure 11:
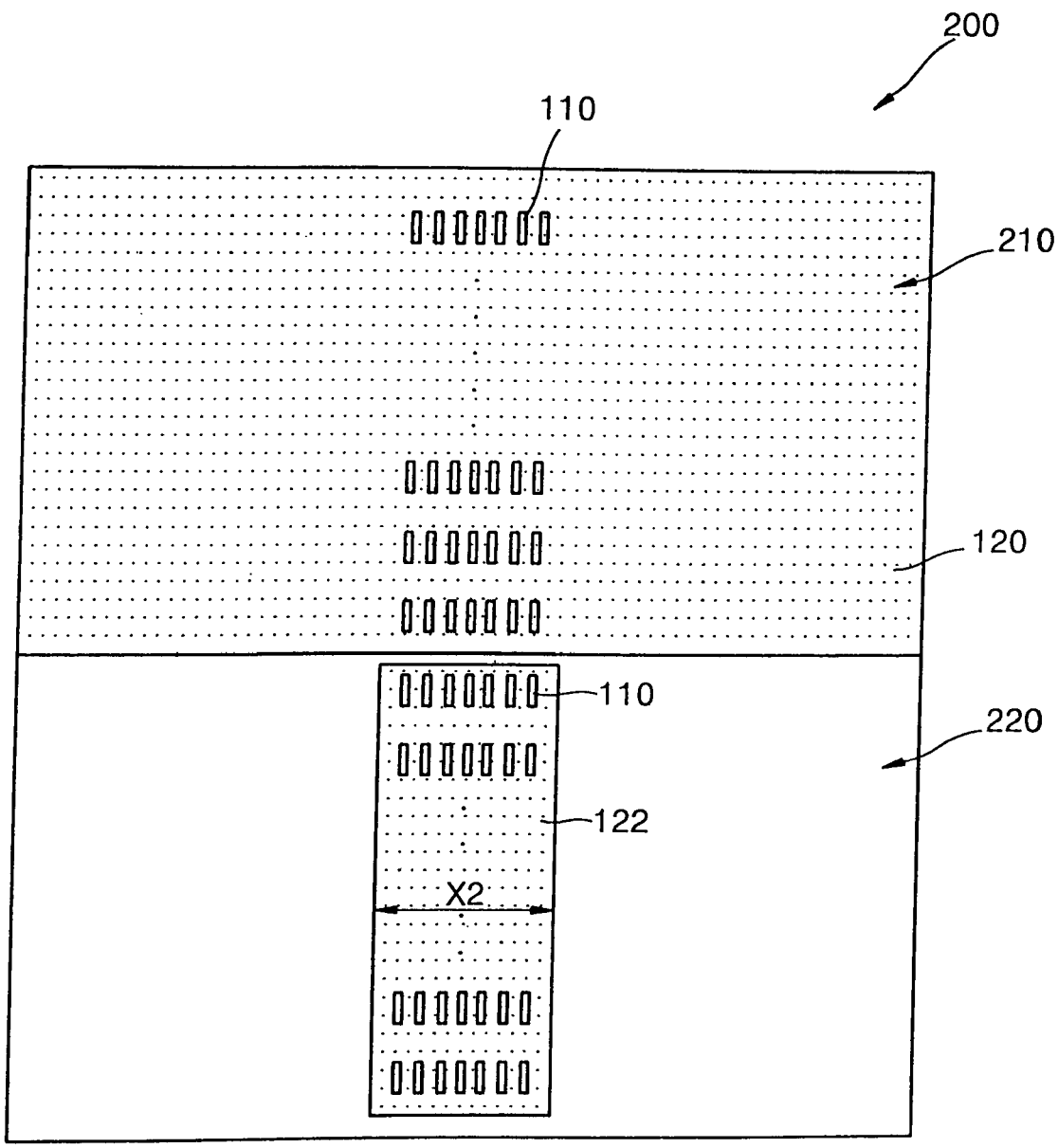

As shown in the embodiment of FIG. 11, a sub light shielding layer 122 in the form of a strip encompasses all of the light transmission patterns 110 in the light transmission region 220. When compared to the embodiment of the second mask 200 of FIG. 6, the width x2 of the sub light shielding layer 122 may be the same as the width x1 of the sub light shielding layers 121. Also, the area of the portion of the sub light shielding layer 122 that is in addition to that of the sub light shielding layers 121 in the embodiment of FIG. 6 is insignificant relative to the total area of the light transmission region 220. Accordingly, the sub light shielding layer 122 can produce the same effects as those of the sub light shielding layers 121 of the embodiment of FIG. 6.

Figure 12A:
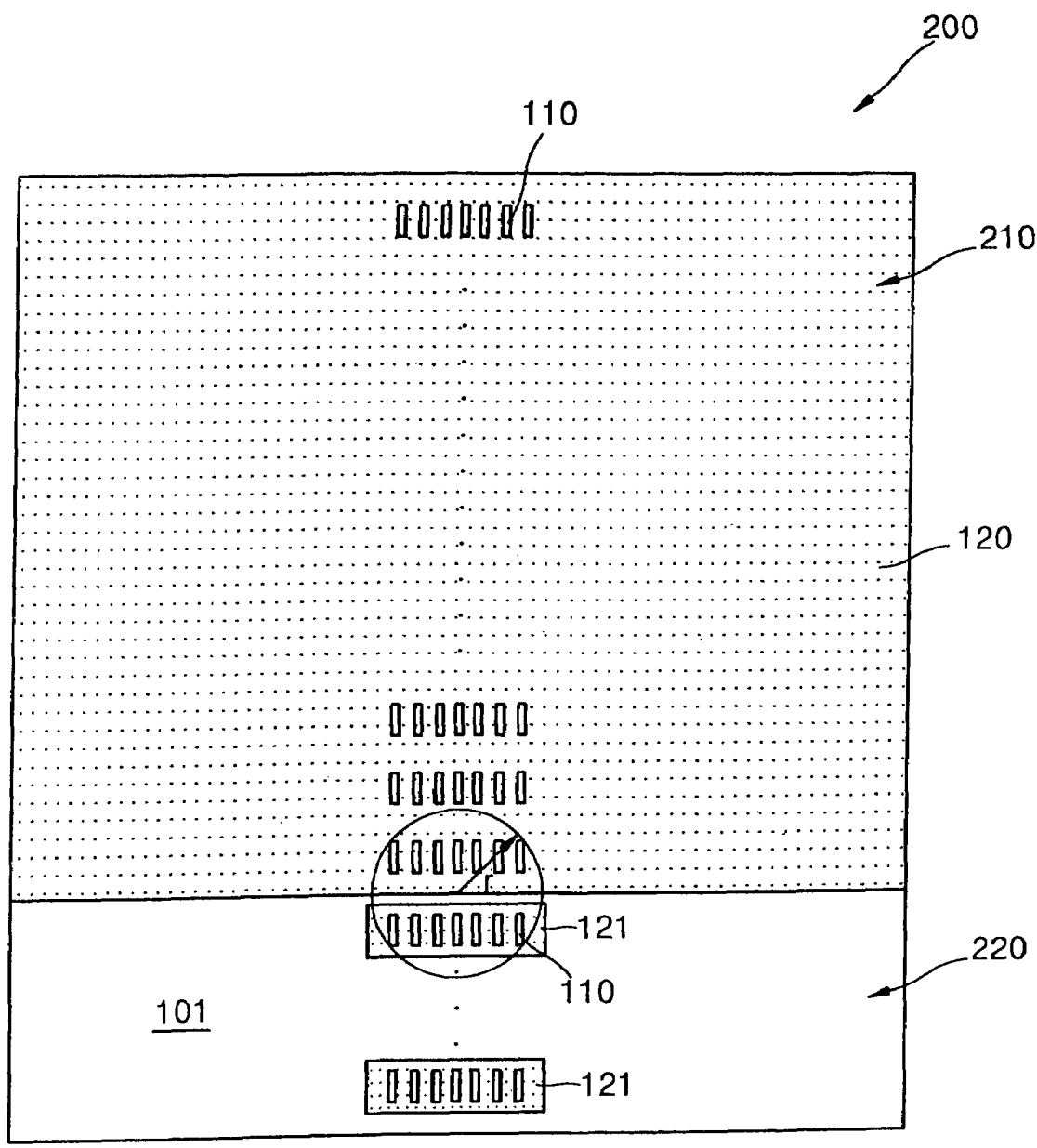
Figure 12B:
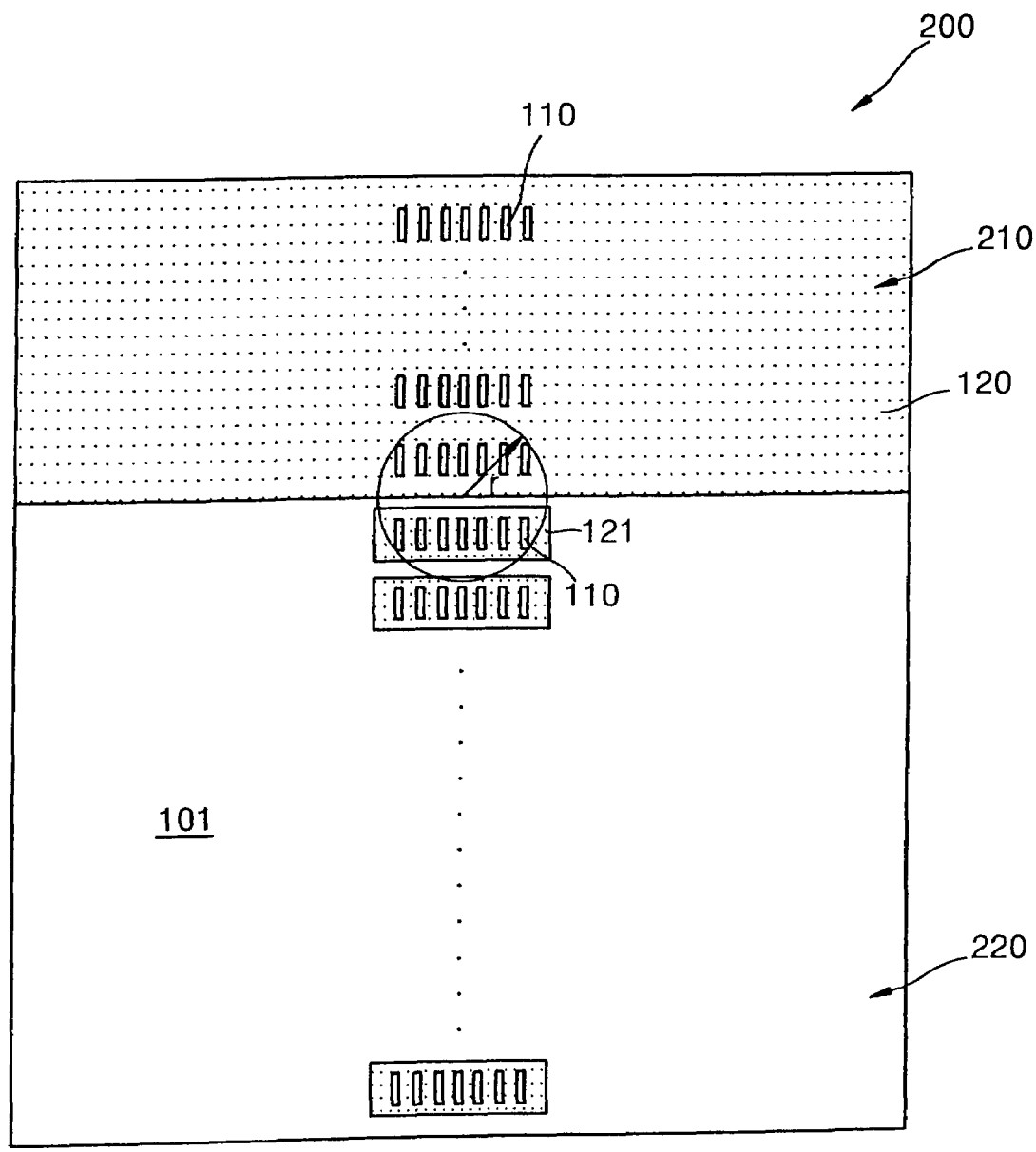

In addition, the relative size of the light shielding region 210 may vary. In other words, as shown in FIGS. 12A and 12B, the boundary between the light shielding region 210 and the light transmission region 220 may be set anywhere along the longitudinal direction of the mask 200. The amount of flare and a flare-affected region on a wafer may be different according to the position of a projection lens. Thus, the amount of flare of each portion of the projection lens and the flare-affected region can be measured by controlling the size of the light shielding region 210, as described above. In addition, the second masks shown in FIGS. 12A and 12B may have a sub light shielding layer in the form of a strip, as shown in FIG. 11, instead of discrete sub light shielding layers 121.

Figure 13:
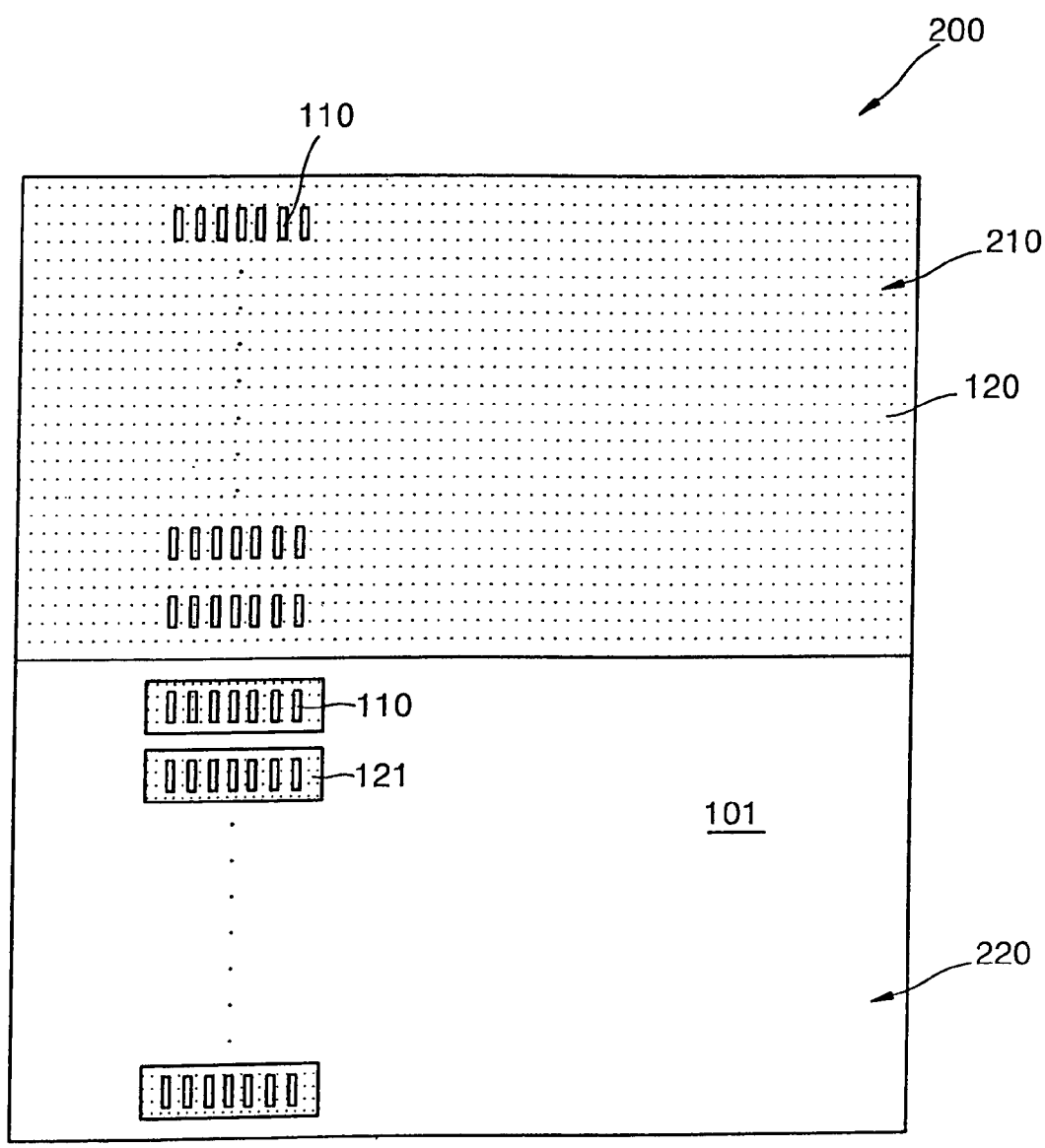

As shown in the embodiment of FIG. 13, the light transmission patterns 110 may be located along an area offset from the longitudinal center of the mask 200. As described above, it is possible to measure the flare-affected region on a wafer at which the light transmission patterns 110, that is, photoresist patterns, are positioned. Thus, it is possible to design the light transmission patterns 110 at the locations where flare is measured.

Figure 14:
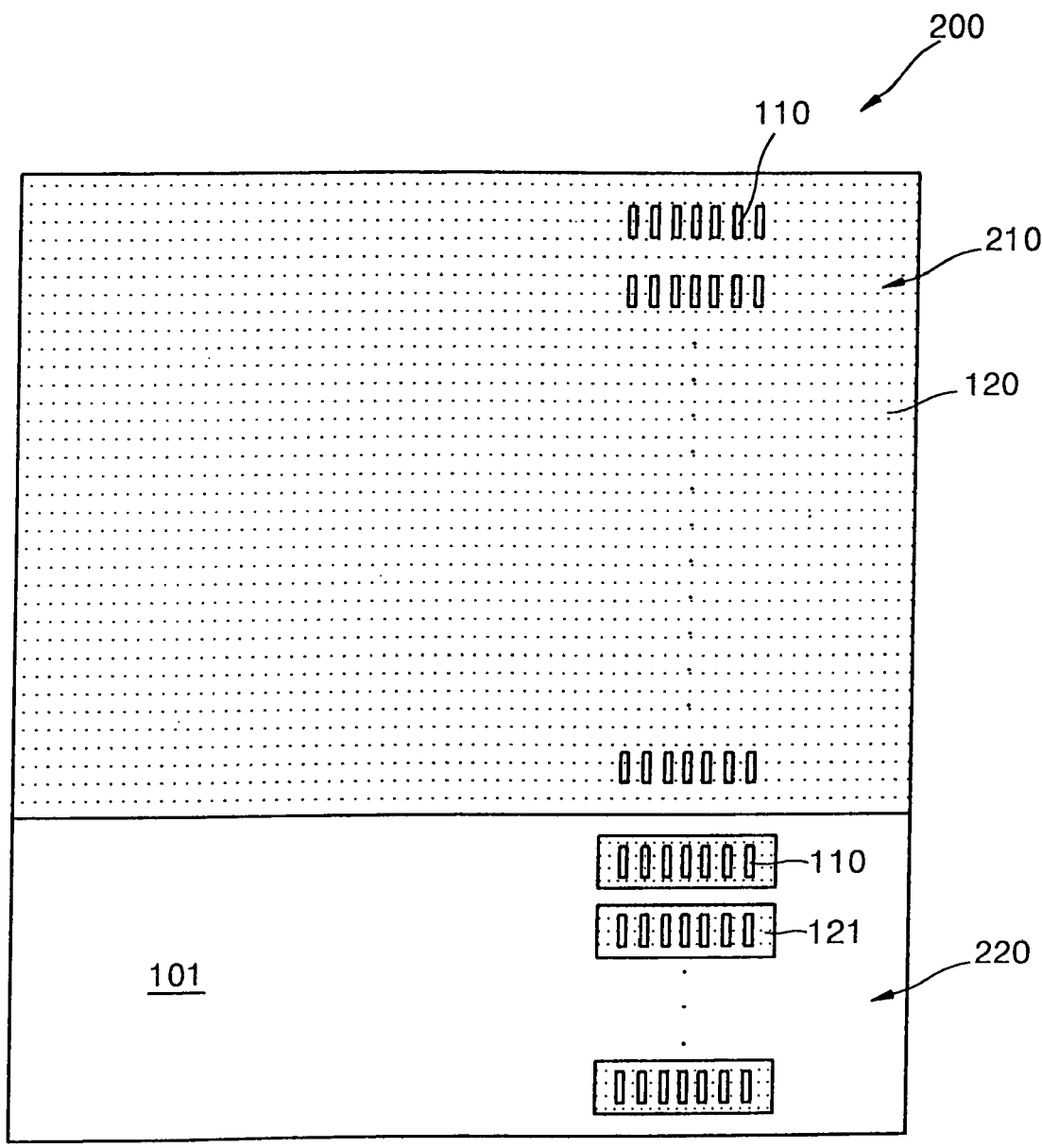

As shown in the embodiment of FIG. 14, the relative size of the light shielding region 220 and the overall position of the light transmission patterns 110 can be designed to facilitate the measuring of the amount of flare at a desired wafer portion. In this example, the boundary between the light shielding region 210 and the light transmission region 220 is offset from the center of the second mask 200, and the light transmission patterns 110 are located in an area to the right of the longitudinal center of the second mask 200.

Figure 15A:
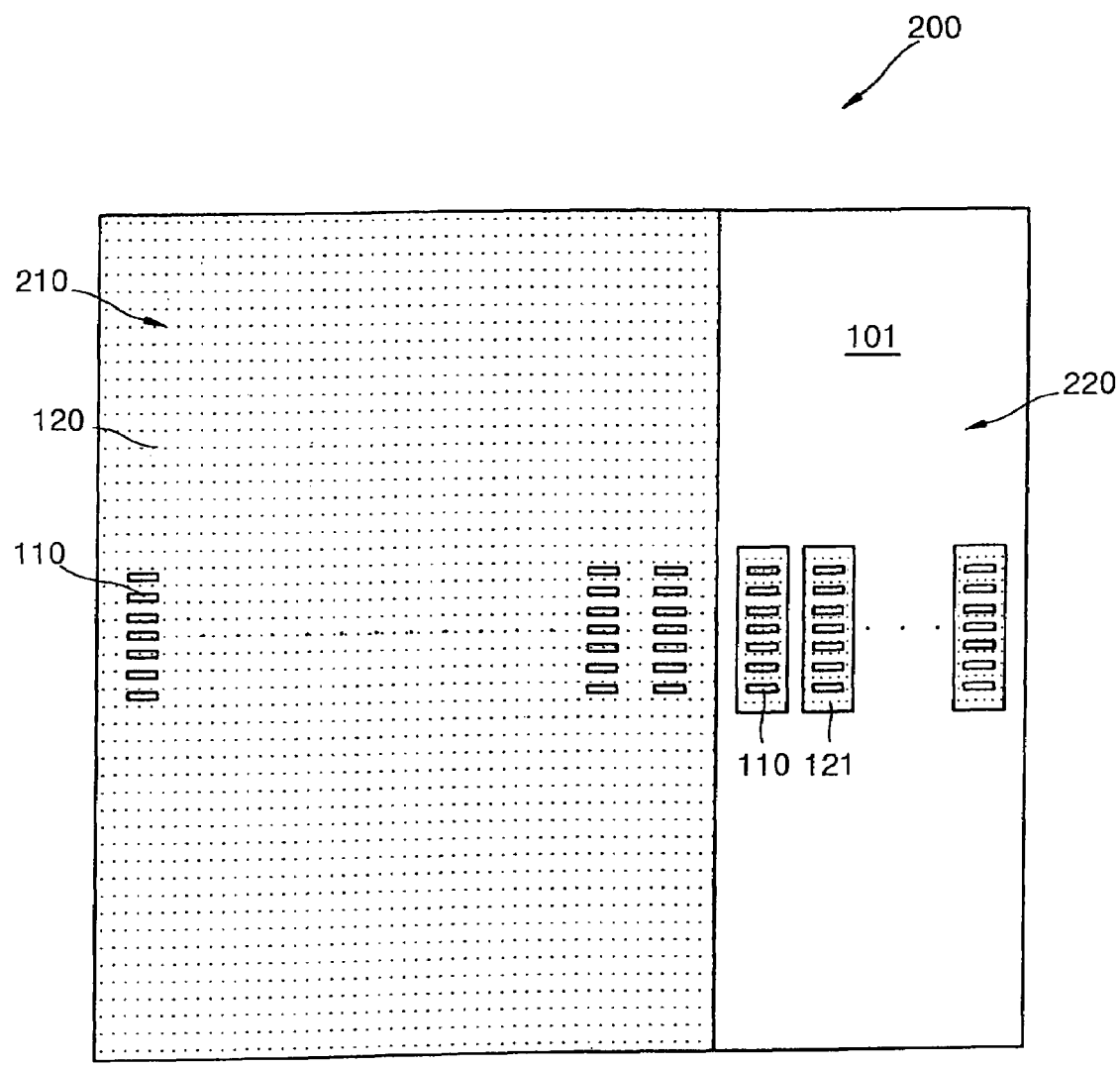
Figure 15B:
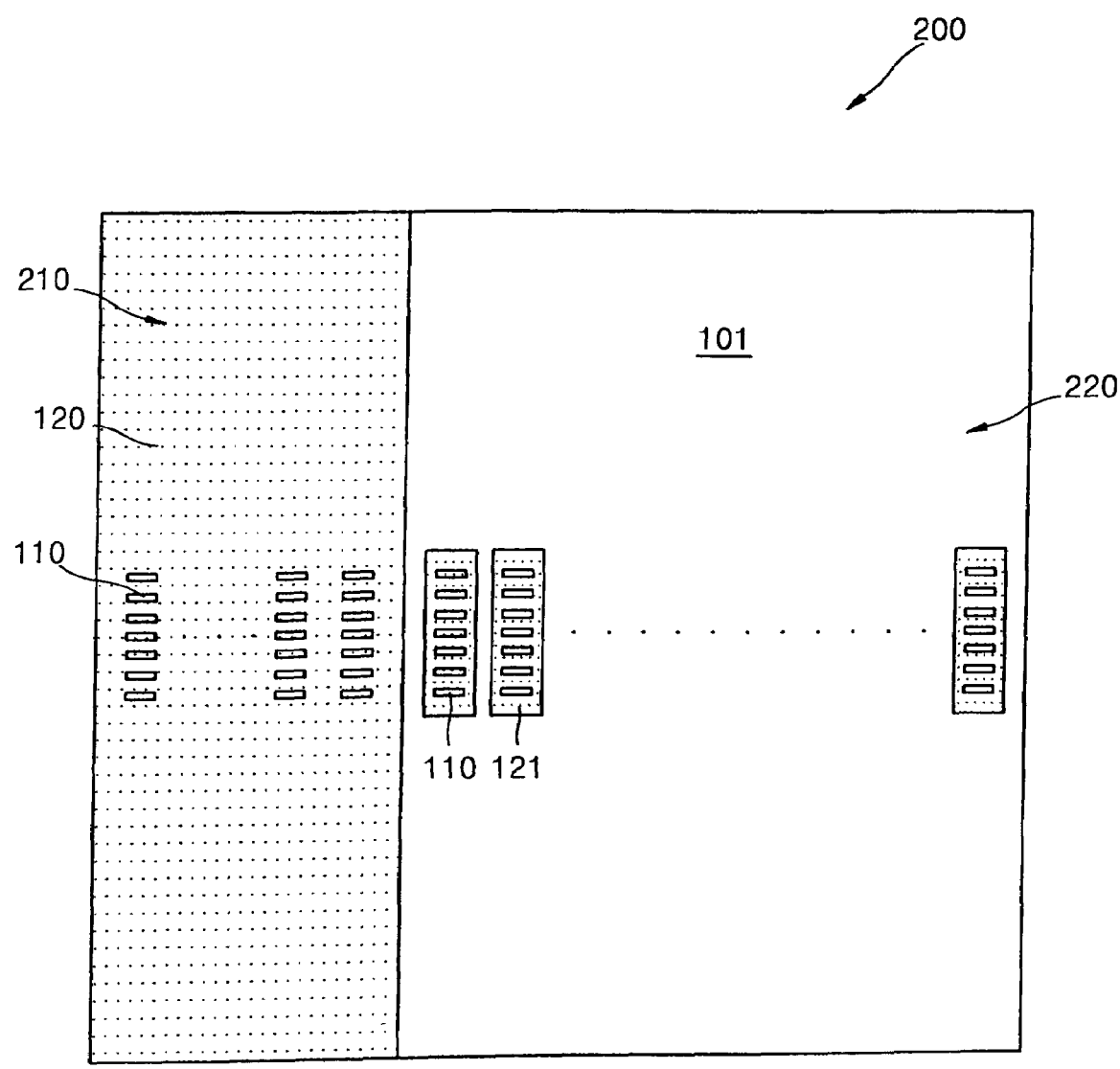

As shown in the embodiments of FIGS. 15A and 15B, the second mask 200 may have the form of any of the second masks shown in FIGS. 6, 11, 12A, 12B, 13, and 14 as rotated by an angle of 90°.

As described above, according to the present invention, whether a projection lens of a photolithographic system produces flare is determined using a mask including a light shielding region having a plurality of light transmission patterns and a light transmission region. Also, the amount of flare produced by the lens and a flare-affected region on a wafer are measured by comparing the line widths of photoresist patterns formed by light from the light shielding region and the light transmission region. In addition, the effective amount of flare of the flare-affected region on a wafer is quantified using the open ratio of the flare-affected region on a wafer. Accordingly, it is possible to predict variations in the line widths of photoresist patterns on a wafer based on the effective amount of flare of the flare-affected region on a wafer, and uniform patterns can be produced on a wafer by designing the line width of mask patterns to compensate for the effective amount of the flare.

In addition, the method of the present invention requires no auxiliary device to be installed in the exposure apparatus. Thus, the present invention can be practiced without incurring a high increase in cost.

Finally, although the present invention has been particularly shown and described with reference to the preferred embodiments thereof, various changes in form and details, as will be apparent to those of ordinary skill in the art may be made to the preferred embodiments without departing from the true spirit and scope of the invention as defined by the appended claims.

What is claimed is:

1. A method of identifying a flare-affected region on a wafer comprising:

mounting a mask in an exposure apparatus of a photolithography system that includes a light source for emitting an exposure light and a projection lens for focusing the exposure light onto a wafer, the mask comprising a mask substrate having a light shielding region and a light transmission region, and each of the regions including at least one group of light transmission patterns transparent to the exposure light;

projecting light emitted by the light source through the mask and projection lens and onto a photoresist layer on a wafer to expose the photoresist layer, and forming photoresist patterns by developing the exposed photoresist layer;

measuring the line widths of photoresist patterns formed by exposure light from the light shielding region of the mask, and the line widths of photoresist patterns formed by exposure light from the light transmission region of the mask;

comparing the line widths of the photoresist patterns formed by exposure light from the light shielding region of the mask to the line widths of the photoresist patterns formed by exposure light from the light transmission region of the mask, and based on said comparing, determining an amount of flare produced by the projection lens;

when the exposed area of the wafer has been determined to have been affected by the flare, discerning an interval on the exposed area of the wafer over which the line widths of the photoresist patterns formed by exposure light from the light transmission region of the mask vary substantially; and identifying a circular region of the wafer, having a radius equal to said interval and a center located at a position corresponding to the boundary between the light transmission region and the sight shielding region, as having been affected by flare produced by the lens during the exposure of the photoresist layer.

2. The method of claim 1, and further comprising determining whether the light transmission patterns of the mask have a uniform size before forming the photoresist patterns using the mask.

3. The method of claim 1, wherein said measuring of the line widths of photoresist patterns comprises scanning the wafer with a scanning device of a measuring apparatus, and said determining whether the exposed area of the wafer has been affected by flare comprises comparing said difference in line widths of the photoresist patterns to a value representative of a measuring precision of the measuring apparatus.

4. A method of designing a mask for producing photoresist patterns in a photolithography process, comprising:

mounting a first mask in an exposure apparatus of a photolithography system that includes a light source for emitting an exposure light and a projection lens for focusing the exposure light onto a wafer, the mask comprising a mask substrate having a light shielding region and a light transmission region discrete from one another, and a light shielding layer that blocks the exposure light at said light shielding region, and each of the regions including at least one group of light transmission patterns transparent to the exposure light;

projecting light emitted by the light source through the mask and projection lens and onto a photoresist layer on a test wafer to expose the photoresist layer, and forming photoresist patterns by developing the exposed photoresist layer;

measuring the line widths of photoresist patterns formed by exposure light from the light shielding region of the mask, and the line widths of photoresist patterns formed by exposure light from the light transmission region of the mask;

comparing the line widths of the photoresist patterns formed by exposure light from the light shielding region of the mask to the line widths of the photoresist patterns formed by exposure light from the light transmission region of the mask, and based on said comparing, determining an amount of flare produced by the projection lens;

discerning an interval on the exposed area of the test wafer over which the line widths of the photoresist patterns formed by exposure light from the light transmission region of the mask vary substantially;

identifying a region of the test wafer based on said interval as having been affected by flare produced by the lens during the exposure of the photoresist layer;

quantifying an effective amount of flare having affected the photoresist patterns formed in the flare-affected region of the test wafer;

producing another mask having light transmission patterns for use in the photolithography system, said producing the another mask comprising configuring, on the basis of the effective amount of flare, the light transmission patterns of the another mask in a region thereof corresponding to the flare-affected region of the test wafer.

5. The method of claim 4, wherein quantifying the effective amount of flare in the flare-affected region comprises:

determining an open ratio of the flare-affected region, wherein the open ratio is a ratio between the entire area of the light shielding layer in a region of the first mask corresponding to the flare-affected region of the test wafer and the sum of the areas of the light shielding patterns and the area of the light transmission region in said region of the first mask corresponding to the flare-affected region of the test wafer; and calculating the effective amount of flare in the flare-affected region by multiplying the amount of flare produced by the projection lens by the open ratio.

6. A method for correcting for flare produced by a projection lens of a photolithography system, the method comprising:

forming photoresist patterns on a wafer by performing an exposure process employing a mask in the photolithography system designed for use in determining whether the projection lens is producing flare;

discriminating a region of the wafer on which the photoresist patterns are formed into a plurality of mesh regions constituting a matrix;

performing a convolution operation on the line widths of the photoresist patterns in each mesh region to obtain a respective convolution value with respect to each of the line widths;

calculating an error value of a critical dimension (CD) of the photoresist patterns in each mesh region using the following Equation:

$$\text{CD error wafer} = \frac{\text{convolution value}}{\text{convolution max}} \times \text{Max CD error}$$

wherein, "CD error wafer" represents an error value of the CD of the photoresist patterns in each mesh region on a corresponding wafer, "convolution value" represents a convolution value with respect to the line widths of the photoresist patterns in each mesh region on the corresponding wafer, "convolution max" represents the maximum value of the convolution values in the matrix of mesh regions, and "Max CD error" represents the maximum difference in the line widths of the photoresist patterns;

producing a new mask having light transmission patterns for use in the photolithography system, said producing the new mask comprising configuring, based on the error value of the CD, the line widths of line patterns in a mask region of the new mask corresponding to the region of the wafer.

7. A method for correcting for flare produced by a projection lens of a reduction projection exposure apparatus of a photolithography system, the method comprising:

forming photoresist patterns on a wafer by performing an exposure process employing a mask in the photolithography system designed for use in determining whether the projection lens is producing flare;

discriminating a region of the wafer on which the photoresist patterns are formed into a plurality of mesh regions constituting a matrix;

performing a convolution operation on the line widths of the photoresist patterns in each mask region to obtain a respective convolution value with respect to each of the line widths;

calculating an error value of a critical dimension (CD) of the photoresist patterns in each mesh region using Equation 1

$$\text{CD error wafer} = \frac{\text{convolution value}}{\text{convolution max}} \times \text{Max CD error} \quad \text{[Equation 1]}$$

wherein, "CD error wafer" represents an error value of the CD of the photoresist patterns in each mesh region on a corresponding wafer, "convolution value" represents a convolution value with respect to the line widths of the photoresist patterns in each mesh region on the corresponding wafer, "convolution max" represents the maximum value of the convolution values in the matrix of mesh regions, and "Max CD error" represents the maximum difference in the line widths of the photoresist patterns;

calculating a mask error enhancement factor (MEEF) of the reduction projection exposure apparatus;

measuring the error value of the CD of patterns in the mask using Equation 2

$$\text{CD correction mask} = \frac{Mag \times \text{CD error wafer}}{MEEF} \quad \text{[Equation 2]}$$

wherein "Mag" represents a reduction projection multiple of the exposure apparatus;

producing a new mask having light transmission patterns for use in the photolithography system, said producing the new mask comprising setting, based on the error value of the CD, the CD of the line widths of line patterns in a region of the new mask corresponding to the region of the wafer.

* * * * *

UNITED STATES PATENT AND TRADEMARK OFFICE
CERTIFICATE OF CORRECTION

| | |
|---|---|
| PATENT NO. | : 7,393,615 B2 |
| APPLICATION NO. | : 10/974950 |
| DATED | : July 1, 2008 |
| INVENTOR(S) | : Roderick Kohle et al. |

Page 1 of 1

It is certified that error appears in the above-identified patent and that said Letters Patent is hereby corrected as shown below:

Column 3, line 11: replace "as well" with -- as well) --;

Column 6, line 26: replace "to 1)" with -- to l) --.

Signed and Sealed this

Twenty-eighth Day of October, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,393,615 B2 |
| APPLICATION NO. | : 10/974950 |
| DATED | : July 1, 2008 |
| INVENTOR(S) | : Won-Tai Ki et al. |

It is certified that error appears in the above-identified patent and that said Letters Patent is hereby corrected as shown below:

This certificate supersedes the Certificate of Correction issued October 28, 2008. The certificate should be vacated since no Certificate of Correction was granted for this patent number.

Signed and Sealed this

Second Day of December, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,393,615 B2 |
| APPLICATION NO. | : 10/974950 |
| DATED | : July 1, 2008 |
| INVENTOR(S) | : Roderick Kohle et al. |

Page 1 of 1

It is certified that error appears in the above-identified patent and that said Letters Patent is hereby corrected as shown below:

Column 3, line 11: replace "as well" with -- as well) --;

Column 6, line 26: replace "to 1)" with -- to I) --.

Signed and Sealed this

Third Day of February, 2009

JOHN DOLL
*Acting Director of the United States Patent and Trademark Office*

UNITED STATES PATENT AND TRADEMARK OFFICE
CERTIFICATE OF CORRECTION

PATENT NO.        : 7,393,615 B2                                          Page 1 of 1
APPLICATION NO.   : 10/974950
DATED             : July 1, 2008
INVENTOR(S)       : Won-Tai Ki et al.

It is certified that error appears in the above-identified patent and that said Letters Patent is hereby corrected as shown below:

This certificate supersedes the Certificate of Correction issued February 3, 2009. The certificate should be vacated since corrections displayed on 1050 does not correspond to location in printed patent.

Signed and Sealed this

Twenty-fourth Day of February, 2009

JOHN DOLL
*Acting Director of the United States Patent and Trademark Office*